(12) United States Patent
Wright et al.

(10) Patent No.: US 12,051,971 B1
(45) Date of Patent: Jul. 30, 2024

(54) COMPACT HIGH-POWER DC-TO-DC CONVERTERS WITH OUT-OF-PHASE CONVERTER UNITS AND MULTIPLE COOLING TYPES

(71) Applicant: DIMAAG-AI, Inc., Fremont, CA (US)

(72) Inventors: Ian Wright, Woodside, CA (US); Max Chapman, Melbourne (AU); Sean McLean, Fremont, CA (US)

(73) Assignee: DIMAAG-AI, Inc., Fremont, CA (US)

( * ) Notice: Subject to any disclaimer, the term of this patent is extended or adjusted under 35 U.S.C. 154(b) by 0 days.

(21) Appl. No.: 18/468,619

(22) Filed: Sep. 15, 2023

(51) Int. Cl.
*H02M 3/00* (2006.01)
*H05K 7/20* (2006.01)
*H01F 27/02* (2006.01)
*H01F 27/10* (2006.01)

(52) U.S. Cl.
CPC ........ *H02M 3/003* (2021.05); *H05K 7/20909* (2013.01); *H05K 7/20927* (2013.01); *H05K 7/20945* (2013.01); *H01F 27/02* (2013.01); *H01F 27/10* (2013.01)

(58) Field of Classification Search
CPC .............. H02M 3/003; H05K 7/20909; H05K 7/20927; H05K 7/20945
See application file for complete search history.

(56) References Cited

U.S. PATENT DOCUMENTS

| | | | |
|---|---|---|---|
| 11,329,570 B1 * | 5/2022 | Heo | H02M 7/003 |
| 11,848,129 B1 | 12/2023 | Wright et al. | |
| 11,872,901 B1 | 1/2024 | Wright et al. | |
| 2011/0227681 A1 | 9/2011 | MacLennan | |
| 2014/0159843 A1 | 6/2014 | Downing | |

(Continued)

FOREIGN PATENT DOCUMENTS

EP  2966660 A1  1/2016

OTHER PUBLICATIONS

Yanchao Li ("High Power Density and High Efficiency DC-DC Converters Based on Wide Bandgap Semiconductors") "A Dissertation in Partial Fulfillment of the Requirements for the Degree of Doctor of Philosophy" Apr. 2019 Fargo, North Dakota. (Year: 2019).*

(Continued)

*Primary Examiner* — Jue Zhang
*Assistant Examiner* — Afework S Demisse
(74) *Attorney, Agent, or Firm* — Polygon IP, LLP

(57) ABSTRACT

Described herein are DC-DC converters with a ratio of the power output to volume of at least 2 kW per liter or even at least 4 kW per liter. Such DC-DC converters can operate at power levels of at least 150 kW or even at least 200 kW. A DC-DC converter comprises an enclosure and a front plate sealed against the enclosure using a set of fasteners. The DC-DC converter also comprises a converter unit comprising a switching sub-module, a diode sub-module, and an inductor as well as an additional converter unit comprising an additional switching sub-module, an additional diode sub-module, and an additional inductor. The switching sub-module and the additional switching sub-module or, more generally, the converter unit and the additional converter unit are configured to operate out of phase. The inductors are immersed cooled, the switching sub-modules are conductively cooled, while the diode sub-modules are convectively cooled.

19 Claims, 17 Drawing Sheets

(56) References Cited

U.S. PATENT DOCUMENTS

| | | |
|---|---|---|
| 2014/0355212 A1 | 12/2014 | Campbell et al. |
| 2016/0128231 A1 | 5/2016 | Wagoner et al. |
| 2017/0126114 A1 | 5/2017 | MacLennan |
| 2018/0042138 A1 | 2/2018 | Campbell et al. |
| 2018/0170198 A1* | 6/2018 | Yang .................. B60L 53/18 |
| 2021/0153392 A1 | 5/2021 | Gao |
| 2022/0037078 A1* | 2/2022 | Yoshioka ............. H02M 3/003 |

OTHER PUBLICATIONS

Matthew et al. ("An Investigation of DC-DC Converter Power Density Using Si and SiC Mosfets"), U.S.N.A. Trident Scholar project report; No. 391 (2010), United States Naval Academy Annapolis, Maryland. (Year: 2010).*

Wright, Ian, et al. "Immersion-Cooled Inductors in DC-to-DC Converters and Methods of Operating Thereof", U.S. Appl. No. 18/468,604, filed Sep. 15, 2023.

Wright, Ian, et al., "Charging Electric Vehicles Using DC-to-DC Converters with Immersion-Cooled Inductors", U.S. Appl. No. 18/468,621, filed Sep. 15, 2023.

Wright, Ian, et al., "Liquid and Air Cooling of DC-to-DC Converters and Methods of Operating Thereof", U.S. Appl. No. 18/468,617, filed Sep. 15, 2023.

* cited by examiner

COMPACT HIGH-POWER DC-TO-DC CONVERTERS WITH OUT-OF-PHASE CONVERTER UNITS AND MULTIPLE COOLING TYPES

BACKGROUND

DC-DC converters are devices used to increase or decrease the DC voltage, i.e., convert one DC voltage level to another. DC-DC converters are used for various applications, e.g., electric vehicles. Cooling can be essential for DC-DC converters, especially their switching components. First, DC-DC converters are not perfectly efficient as some of the electrical energy is lost as heat.

Specifically, in high-power applications (e.g., above 100 kW), the heat generated can be substantial (e.g., more than 1 kW in some situations). Cooling helps dissipate this heat, preventing the converter from overheating and ensuring that it operates at its rated efficiency. Cooling is particularly important in small high-power DC-DC converters that have high levels of heat dissipation but not enough thermal mass for this heat to dissipate into. Furthermore, electronic components (e.g., transistors and diodes) have temperature limits beyond which these components can be damaged, or their performance can degrade, thereby requiring constant cooling. Overall, temperature fluctuations (caused by heating) can affect the performance and accuracy of various components of DC-DC converters. Various cooling methods have been proposed for DC-DC converters, e.g., passive cooling (such as heat sinks) and active cooling (such as fans or liquid cooling). However, integration of cooling into DC-DC converters, especially high-power DC-DC converters, while maintaining the small size of these converters has been challenging. Cooling components require a significant amount of space. Furthermore, establishing thermal coupling with various heat-generating components (e.g., inductors, and switches) can be difficult.

What is needed are new types of DC-DC converters or, more specifically, new arrangements of various components in DC-DC converters enabling efficient cooling during high-power applications (e.g., above 100 kW).

SUMMARY

Described herein are DC-DC converters having various immersion-cooling features enabling high-power applications, such as cross-charging electric vehicles. For example, the inductor of a DC-DC converter may be formed using metal and insulator sheets stacked and wound into an inductor coil assembly. The metal sheet comprises grooves, extending parallel to the coil axis and forming coil fluid pathways through this assembly thereby providing immersion cooling to the inductor. An inductor-cooling liquid may be pumped through these fluid pathways while being in direct contact with the metal sheet, at least around the grooves. In some examples, these grooves are distributed along the entire length of the metal sheet. Multiple inductors may be used to enable operations of multiple converter units, e.g., operating out of phase. These inductors may be fluidically interconnectors and have the same cooling features.

Also described herein are DC-DC converters with electronic module cooling units used for air-convection cooling of some components of power electronic modules and conductive cooling of other components, e.g., switching sub-modules. A cooling unit may have a heat exchanger and a cooling plate, thermally coupled to one or more heat exchangers and one or more switching sub-modules. For example, the cooling plate can be positioned between and thermally coupled to heat exchangers. One fan can direct air through one heat exchanger and to one power electronic module as a part of convection cooling. An additional fan can direct air through the second heat exchanger and to the second power electronic module. The cooling plate can be also positioned between and thermally coupled to switching sub-modules of these power electronic modules thereby enabling conductive cooling. The plate-cooling liquid is pumped through the cooling plate.

Further described herein are DC-DC converters with a ratio of the power output to volume of at least 2 kW per liter or even at least 4 kW per liter. Such DC-DC converters can operate at power levels of at least 150 kW or even at least 200 kW. A DC-DC converter comprises an enclosure and a front plate sealed against the enclosure using a set of fasteners. The DC-DC converter also comprises a converter unit comprising a switching sub-module, a diode sub-module, and an inductor as well as an additional converter unit comprising an additional switching sub-module, an additional diode sub-module, and an additional inductor. The switching sub-module and the additional switching sub-module or, more generally, the converter unit and the additional converter unit are configured to operate out of phase. The inductors are immersed cooled, the switching sub-modules are conductively cooled, while the diode sub-modules are convectively cooled.

Also described herein are vehicle charging systems, each comprising a recharge vehicle and a work vehicle configured to form an electrical connection and charge the work vehicle battery from the recharge vehicle battery. In some examples, this charging is performed at 500 kW or more or even at 1,000 kW or more. Furthermore, the connection and/or charging can be performed while both vehicles are moving (e.g., the recharge vehicle moving in front of the work vehicle). The recharge vehicle comprises one or more DC-DC converters, configured to boost a first voltage (V1) of the recharge vehicle battery to a second voltage (V2) of the work vehicle battery. It should be noted that these voltages vary depending on the state of charge of these batteries. In some examples, each DC-DC converter utilizes a combination of immersion, conductive, and convective cooling for different components of the converter.

Clause 1. A DC-DC converter comprising: a converter unit comprising a power electronic module and an inductor, wherein: the power electronic module comprises a switching sub-module and a diode sub-module, the inductor comprises a metal sheet and an insulator sheet stacked and wound together into an inductor coil assembly, comprising a coil axis, and the metal sheet comprises grooves, extending parallel to the coil axis and forming coil fluid pathways together with the insulator sheet and remaining portions of the metal sheet.

Clause 2. The DC-DC converter of clause 1, wherein: the metal sheet has a length, and the grooves are evenly distributed along the length of the metal sheet.

Clause 3. The DC-DC converter of clause 1, wherein: the inductor comprises an inductor housing, sealably enclosing the inductor coil assembly and comprising a first inductor fluid connector and a second inductor fluid connector, and the coil fluid pathways fluidically couple the first inductor fluid connector and the second inductor fluid connector.

Clause 4. The DC-DC converter of clause 3, wherein a combined cross-sectional area of the coil fluid pathways is equal or greater than an orifice area of each of the first inductor fluid connector and the second inductor fluid connector.

Clause 5. The DC-DC converter of clause 3, wherein a combined cross-sectional area of the coil fluid pathways is at least 50 square millimeters.

Clause 6. The DC-DC converter of clause 3, wherein the inductor further comprises a flow distribution plate positioned between the first inductor fluid connector and the inductor coil assembly or between the second inductor fluid connector and the inductor coil assembly.

Clause 7. The DC-DC converter of clause 1, wherein the metal sheet comprises at least 100 instances of the grooves.

Clause 8. The DC-DC converter of clause 1, wherein each of the grooves has a semicircular shape.

Clause 9. The DC-DC converter of clause 1, wherein each of the grooves has a height of 0.2-0.8 millimeters.

Clause 10. The DC-DC converter of clause 1, wherein each of the coil fluid pathways is formed together by a corresponding one of the grooves and a portion of the insulator sheet adhered to an adjacent layer of the metal sheet.

Clause 11. The DC-DC converter of clause 1, wherein: the grooves further form additional coil fluid pathways such that each adjacent pair of the additional coil fluid pathways is separated by the metal sheet, formed into a corresponding one of the grooves, and the additional coil fluid pathways have an elongated shape tapering away from the corresponding one of the grooves.

Clause 12. The DC-DC converter of clause 1, further comprising an additional converter unit, wherein: the additional converter unit comprising an additional inductor, the additional inductor comprises an additional metal sheet and an additional insulator sheet stacked and wound into an additional inductor coil assembly, comprising an additional coil axis, the additional metal sheet comprises additional grooves, extending parallel to the additional coil axis and forming additional coil fluid pathways together with the additional insulator sheet and remaining portions of the additional metal sheet, and the additional inductor is fluidically coupled to the inductor.

Clause 13. The DC-DC converter of clause 12, wherein the converter unit and the additional converter unit are configured to operate out of phase.

Clause 14. The DC-DC converter of clause 12, further comprising a front plate, a first inductor-cooling coupler, a second inductor-cooling coupler, a first fluid connection, and a second fluid connection, wherein: the first fluid connection and the second fluid connection are positioned on the front plate, the inductor comprises a first inductor fluid connector, a second inductor fluid connector, and a flow splitter, the additional inductor comprises a first additional inductor fluid connector, a second additional inductor fluid connector, and an additional flow splitter, the first inductor fluid connector is coupled to and configured to receive an inductor-cooling liquid from the first inductor-cooling coupler, the flow splitter is coupled to the second additional inductor fluid connector by the first fluid connection and is configured to split the inductor-cooling liquid, received from the first inductor fluid connector, into a first portion, directed to the inductor coil assembly, and a second portion, directed to the first fluid connection, the second inductor fluid connector is connected to the additional flow splitter by the second fluid connection, and the additional flow splitter is configured to combine the first portion of the inductor-cooling liquid, received from the additional inductor coil assembly, and the second portion, received from the second fluid connection, into a combined fluid flow and direct the combined fluid flow to the first additional inductor fluid connector, coupled to the second inductor-cooling coupler.

Clause 15. The DC-DC converter of clause 14, wherein the first fluid connection and the second fluid connection are configured to maintain substantially same flow rates.

Clause 16. A method of operating a DC-DC converter, the method comprising: providing a DC-DC converter comprising a converter unit comprising a power electronic module and an inductor, wherein: the power electronic module comprises a switching sub-module and a diode sub-module, the inductor comprises a metal sheet and an insulator sheet stacked and wound together into an inductor coil assembly, comprising a coil axis, and the metal sheet comprises grooves, extending parallel to the coil axis and forming coil fluid pathways together with the insulator sheet and remaining portions of the metal sheet; and flowing an inductor-cooling liquid through the coil fluid pathways while operating the DC-DC converter to boost an output voltage relative to an input voltage.

Clause 17. The method of clause 16, wherein the inductor-cooling liquid comes in direct contact with portions of the metal sheet forming the grooves.

Clause 18. The method of clause 16, wherein the DC-DC converter operates at a rate of at least 200 kW for at least a period of time.

Clause 19. The method of clause 16, further comprising: monitoring temperature of the inductor-cooling liquid upon exiting the inductor coil assembly; and adjusting a volumetric flow rate of the inductor-cooling liquid through the inductor coil assembly based on the temperature of the inductor-cooling liquid upon exiting the inductor coil assembly.

Clause 20. The method of clause 16, further comprising: monitoring temperature of the inductor-cooling liquid upon exiting the inductor coil assembly; and adjusting power output of the DC-DC converter based on the temperature of the inductor-cooling liquid upon exiting the inductor coil assembly.

Clause 21. A DC-DC converter comprising: a converter unit comprising a power electronic module and an inductor, wherein: the power electronic module comprises a switching sub-module and a diode sub-module, and the inductor comprises a metal sheet and an insulator sheet stacked and wound into an inductor coil assembly, comprising a coil axis; an additional converter unit comprising an additional power electronic module and an additional inductor; and an electronic module cooling unit, comprising a heat exchanger, a fan, a manifold, and a cooling plate thermally coupled to the heat exchanger and to at least a portion of the power electronic module, wherein: the manifold encloses the heat exchanger and is configured to direct air from the fan to the power electronic module, and the cooling plate extends between and is thermally coupled to each of the power electronic module and the additional power electronic module.

Clause 22. The DC-DC converter of clause 21, wherein the manifold comprises a set of flow distributors, evenly distributed along an edge of the power electronic module.

Clause 23. The DC-DC converter of clause 22, wherein: the manifold comprises a first manifold portion, a second manifold portion, and a turn portion such that the turn portion interconnects the first manifold portion and the second manifold portion, and the first manifold portion and the second manifold portion are configured to flow air in opposite directions.

Clause 24. The DC-DC converter of clause 23, wherein: the heat exchanger is positioned within the first manifold portion, and the set of flow distributors is positioned within the second manifold portion.

Clause 25. The DC-DC converter of clause 21, wherein the heat exchanger comprises a set of metal ridges extending parallel to each other and away from the cooling plate.

Clause 26. The DC-DC converter of clause 21, wherein the cooling plate comprises an interior cavity, extending between a cavity inlet and a cavity outlet and configured to flow a plate-cooling liquid through the cooling plate between the cavity inlet and the cavity outlet.

Clause 27. The DC-DC converter of clause 26, further comprising a front plate, a first plate-cooling coupler, and a second plate-cooling coupler, wherein: each of the first plate-cooling coupler and the second plate-cooling coupler protrudes through and supported by the front plate, the cavity inlet is fluidically coupled to the first plate-cooling coupler, and the cavity outlet is fluidically coupled to the second plate-cooling coupler.

Clause 28. The DC-DC converter of clause 27, wherein both the cavity inlet and the cavity outlet are positioned along an edge of the cooling plate proximate to the front plate.

Clause 29. The DC-DC converter of clause 26, wherein: the interior cavity comprises an electronic module-aligned cavity portion, the cooling plate comprises cavity studs that extend through the electronic module-aligned cavity portion between opposite walls of the cooling plate, and a projection of the power electronic module overlaps with the electronic module-aligned cavity portion.

Clause 30. The DC-DC converter of clause 26, wherein: the interior cavity comprises a heat-exchanger-aligned cavity portion formed by a serpentine-shaped channel, and a projection of the heat exchanger overlaps with the heat-exchanger-aligned cavity portion.

Clause 31. The DC-DC converter of clause 21, further comprising an additional electronic module cooling unit, comprising an additional heat exchanger, an additional fan, and an additional manifold, wherein the cooling plate is positioned between and thermally coupled to each of the heat exchanger and the additional heat exchanger.

Clause 32. The DC-DC converter of clause 21, wherein the converter unit and the additional converter unit are configured to operate out of phase.

Clause 33. The DC-DC converter of clause 21, further comprises an inductor and an additional inductor, wherein: the power electronic module is electrically connected to the inductor, the additional power electronic module is electrically connected to the additional inductor, and the cooling plate extends between the inductor and the additional inductor.

Clause 34. The DC-DC converter of clause 33, wherein the electronic module cooling unit extends between the power electronic module and the additional inductor.

Clause 35. The DC-DC converter of clause 33, further comprising a front plate, a first inductor-cooling coupler, a second inductor-cooling coupler, a first plate-cooling coupler, and a second plate-cooling coupler, wherein: each of the first inductor-cooling coupler, the second inductor-cooling coupler, the first plate-cooling coupler, the second plate-cooling coupler, protrudes through and supported by the front plate, each of the first inductor-cooling coupler and the second inductor-cooling coupler are fluidically coupled to the inductor and the additional inductor, each of the first plate-cooling coupler and the second plate-cooling coupler are fluidically coupled to the cooling plate, and the cooling plate is fluidically isolated from the inductor and the additional inductor.

Clause 36. A method of operating a DC-DC converter, the method comprising: providing a DC-DC converter comprising a converter unit, an additional converter unit, and an electronic module cooling unit, wherein: the converter unit comprises a power electronic module and an inductor, the power electronic module comprises a switching sub-module and a diode sub-module, the inductor comprises a metal sheet and an insulator sheet stacked and wound into an inductor coil assembly, comprising a coil axis, the additional converter unit comprises an additional power electronic module and an additional inductor, the electronic module cooling unit comprises a heat exchanger, a fan, a manifold, and a cooling plate thermally coupled to the heat exchanger and to at least a portion of the power electronic module, the manifold encloses the heat exchanger and is configured to direct air from the fan to the power electronic module, and the cooling plate extends between and is thermally coupled to each of the power electronic module and the additional power electronic module; and flowing air into and through the manifold using the fan, wherein: the air releases heat to the heat exchanger while passing through the heat exchanger, and after passing through the heat exchanger, the air is uniformly released to the power electronic module.

Clause 37. The method of clause 36, further comprising flowing a plate-cooling liquid through the cooling plate.

Clause 38. The method of clause 37, further comprising flowing an inductor-cooling liquid through an inductor and an additional inductor of the DC-DC converter, wherein the inductor-cooling liquid is different from the plate-cooling liquid.

Clause 39. The method of clause 36, further comprising: monitoring temperature of the power electronic module; and adjusting speed of the fan based on the temperature of the power electronic module.

Clause 40. The method of clause 36, further comprising: monitoring temperature of the power electronic module; and adjusting a volumetric flow rate of a plate-cooling liquid through the cooling plate based on the temperature of the power electronic module.

Clause 41. A DC-DC converter comprising: an enclosure; a front plate sealed against the enclosure using a set of fasteners and collectively with the enclosure defining a converter volume (V); a converter unit comprising a switching sub-module, a diode sub-module, and an inductor, wherein the switching sub-module and diode sub-module are arranged into a power electronic module; and an additional converter unit comprising an additional switching sub-module, an additional diode sub-module, and an additional inductor, wherein: the additional switching sub-module and the additional diode sub-module are arranged into an additional power electronic module, the switching sub-module and the additional switching sub-module are configured to operate out of phase, and a ratio of power output (P) of the DC-DC converter to the converter volume (V) is at least 2 kW per liter.

Clause 42. The DC-DC converter of clause 41, wherein the ratio of the power output (P) of the DC-DC converter to the converter volume (V) is at least 4 kW per liter.

Clause 43. The DC-DC converter of clause 41, wherein: the power output (P) of the DC-DC converter is at least 150 kW, and the converter volume (V) is less than 50 liters.

Clause 44. The DC-DC converter of clause 41, wherein: the power output (P) of the DC-DC converter is at least 200 kW, and the converter volume (V) is less than 40 liters.

Clause 45. The DC-DC converter of clause 41, wherein the converter unit and the additional converter unit are configured to operate out of phase.

Clause 46. The DC-DC converter of clause 41, wherein each of the inductor and the additional inductor is immersion-liquid cooled.

Clause 47. The DC-DC converter of clause 41, further comprising a front plate, a first inductor-cooling coupler, and a second inductor-cooling coupler, wherein: each of the first inductor-cooling coupler and the second inductor-cooling coupler protrudes through and is supported by the front plate, each of the first inductor-cooling coupler and the second inductor-cooling coupler are fluidically coupled to the inductor and the additional inductor.

Clause 48. The DC-DC converter of clause 47, further comprising low-voltage connectors, high-voltage connectors, a set of low-voltage capacitors, and a set of high-voltage capacitors, wherein: each of the low-voltage connectors and the high-voltage connectors protrudes through and is supported by the front plate, the set of low-voltage capacitors is connected across the low-voltage connectors, and the set of high-voltage capacitors is connected across the high-voltage connectors.

Clause 49. The DC-DC converter of clause 48, wherein the set of high-voltage capacitors comprises three capacitors connected in parallel.

Clause 50. The DC-DC converter of clause 47, further comprising a cooling plate, a first plate-cooling coupler, and a second plate-cooling coupler, wherein: each of the first plate-cooling coupler and the second plate-cooling coupler protrudes through and is supported by the front plate, each of the first plate-cooling coupler and the second plate-cooling coupler is fluidically coupled to the cooling plate, and the cooling plate is fluidically isolated from the inductor and the additional inductor.

Clause 51. The DC-DC converter of clause 50, wherein the cooling plate is positioned between and thermally coupled to each of (1) a first set of the switching sub-module and the diode sub-module and (2) a second set of the additional switching sub-module and the additional diode sub-module.

Clause 52. The DC-DC converter of clause 50, wherein the cooling plate comprises an interior cavity, extending between a cavity inlet and a cavity outlet and configured to flow a plate-cooling liquid through the cooling plate between the cavity inlet and the cavity outlet.

Clause 53. The DC-DC converter of clause 50, further comprising an additional electronic module cooling unit, comprising an additional heat exchanger, an additional fan, and an additional manifold, wherein the cooling plate is positioned between and thermally coupled to each of the heat exchanger and the additional heat exchanger.

Clause 54. The DC-DC converter of clause 50, wherein the converter unit and the additional converter unit are configured to operate out of phase.

Clause 55. The DC-DC converter of clause 50, wherein: the power electronic module is electrically connected to the inductor, the additional power electronic module is electrically connected to the additional inductor, and the cooling plate extends between the inductor and the additional inductor.

Clause 56. A method of operating a DC-DC converter, the method comprising: providing a DC-DC converter comprising an enclosure, a front plate, and a converter unit, wherein: a front plate sealed against the enclosure using a set of fasteners and collectively with the enclosure defining a converter volume (V); a converter unit comprising a switching sub-module, a diode sub-module, and an inductor; and an additional converter unit comprising an additional switching sub-module, an additional diode sub-module, and an additional inductor, and a ratio of power output (P) of the DC-DC converter to the converter volume (V) is at least 2 kW per liter; and operating the DC-DC converter to boost an output voltage relative to an input voltage at a power of at least 200 kW.

Clause 57. The method of clause 56, wherein operating the DC-DC converter comprises flowing an inductor-cooling liquid through the inductor and the additional inductor such that the inductor and the additional inductor are immersion-liquid cooled.

Clause 58. The method of clause 56, wherein: the DC-DC converter further comprises a cooling plate fluidically isolated from the inductor and the additional inductor and thermally coupled to the switching sub-module and the additional switching sub-module, and operating the DC-DC converter comprises flowing a plate-cooling liquid through the cooling plate.

Clause 59. The method of clause 56, wherein the converter unit and the additional converter unit are configured to operate out of phase.

Clause 60. The method of clause 56, wherein the converter volume (V) is less than 50 liters.

Clause 61. A vehicle charging system comprising: a recharge vehicle comprising a recharge-vehicle battery operating at a first voltage (V1), a recharge-vehicle charging port, a DC-DC converter electrically interconnecting the recharge-vehicle battery and the recharge-vehicle charging port; and a work vehicle comprising a work-vehicle battery operating at a second voltage (V2) and a work-vehicle charging port electrically coupled to the work-vehicle battery, wherein: a combination of the recharge-vehicle charging port and the work-vehicle charging port is configured to form an electrical connection between the DC-DC converter and the work-vehicle battery and to transmit electrical power from the recharge-vehicle battery through the DC-DC converter and to the work-vehicle battery, and the DC-DC converter is configured to boost the first voltage (V1) to the second voltage (V2) while transmitting the electrical power from the recharge-vehicle battery to the work-vehicle battery.

Clause 62. The vehicle charging system of clause 61, wherein: the first voltage (V1) changes based on the state of charge (SOC) of the recharge-vehicle battery, the second voltage (V2) changes based on the state of charge (SOC) of the work-vehicle battery, a maximum value of the first voltage (V1) is less than a minimum value of the second voltage (V2).

Clause 63. The vehicle charging system of clause 61, wherein the DC-DC converter comprises: a converter unit comprising a switching sub-module, a diode sub-module, and an inductor, and the inductor is immersion-liquid cooled using an inductor-cooling liquid.

Clause 64. The vehicle charging system of clause 63, wherein: the recharge-vehicle battery is immersion-liquid cooled using the inductor-cooling liquid, the recharge-vehicle battery comprises a liquid-cooling unit for cooling the inductor-cooling liquid, and the recharge-vehicle battery further comprises a liquid pump system for pumping the inductor-cooling liquid through the inductor, the recharge-vehicle battery, and the liquid-cooling unit.

Clause 65. The vehicle charging system of clause 63, wherein: at least the switching sub-module and the diode sub-module are arranged on and parts of a power electronic module of the DC-DC converter, the DC-DC converter further comprises an electronic module cooling unit for cooling the power electronic module, and the electronic module cooling unit comprises a cooling plate thermally coupled to the power electronic module.

Clause 66. The vehicle charging system of clause 65, wherein: the cooling plate comprises a cavity inlet, a cavity outlet, and an interior cavity fluidically coupled with the cavity inlet and the cavity outlet, the cavity inlet and the cavity outlet are configured to flow a plate-cooling liquid through the interior cavity, and the recharge-vehicle battery is cooled using the plate-cooling liquid.

Clause 67. The vehicle charging system of clause 63, wherein the DC-DC converter further comprises an additional converter unit such that the converter unit and the additional converter unit are configured to operate out of phase.

Clause 68. The vehicle charging system of clause 61, wherein the DC-DC converter has a ratio of power output (P) to converter volume (V) of at least 2 kW per liter.

Clause 69. The vehicle charging system of clause 61, wherein the vehicle charging system is configured to transmit the electrical power from the recharge-vehicle battery to the work-vehicle battery at a level of at least 100 kW.

Clause 70. The vehicle charging system of clause 61, wherein the vehicle charging system is configured to transmit the electrical power from the recharge-vehicle battery to the work-vehicle battery while both the recharge-vehicle battery and the work-vehicle battery are moving.

Clause 71. The vehicle charging system of clause 61, wherein: the work vehicle is a human-controlled vehicle, the recharge vehicle is an autonomous vehicle, and a recharge-vehicle steering system of the recharge vehicle is controlled based on driver input to a work-vehicle steering system of the work vehicle while the recharge vehicle moves in front of the work vehicle.

Clause 72. The vehicle charging system of clause 61, wherein: each of the work vehicle and the recharge vehicle is an autonomous vehicle, and movement of the work vehicle is based on the movement of the recharge vehicle while the recharge vehicle moves in front of the work vehicle.

Clause 73. The vehicle charging system of clause 61, wherein the work vehicle is a tractor.

Clause 74. The vehicle charging system of clause 61, wherein either one of the work-vehicle charging port or the recharge-vehicle charging port comprises a telescopic extender.

Clause 75. A method of remote charging of a work vehicle using a recharge vehicle, the method comprising: forming an electrical connection between the work vehicle and the recharge vehicle, wherein: the recharge vehicle comprises a recharge-vehicle battery operating at a first voltage (V1), a recharge-vehicle charging port, a DC-DC converter electrically interconnecting the recharge-vehicle battery and the recharge-vehicle charging port, the work vehicle comprises a work-vehicle battery operating at a second voltage (V2) and a work-vehicle charging port electrically coupled to the work-vehicle battery, and the electrical connection is formed using the recharge-vehicle charging port and the work-vehicle charging port; charging the work-vehicle battery by transmitting electric power from the recharge-vehicle battery to the work-vehicle battery through the electrical connection while the DC-DC converter boosts the first voltage (V1) to the second voltage (V2); and interrupting the electrical connection between the work vehicle and the recharge vehicle.

Clause 76. The method of clause 75, wherein: the DC-DC converter comprises a converter unit comprising a switching sub-module, a diode sub-module, and an inductor, and the inductor is immersion-liquid cooled using an inductor-cooling liquid such that, while the DC-DC converter boosts the first voltage (V1) to the second voltage (V2), the inductor-cooling liquid is pumped through the inductor.

Clause 77. The method of clause 76, wherein, while the electric power is transmitted from the recharge-vehicle battery to the work-vehicle battery, the inductor-cooling liquid is further pumped through the recharge-vehicle battery.

Clause 78. The method of clause 75, wherein the DC-DC converter further comprises an additional converter unit such that the converter unit and the additional converter unit are configured to operate out of phase while the electric power is transmitted from the recharge-vehicle battery to the work-vehicle battery.

Clause 79. The method of clause 75, wherein the electric power is transmitted from the recharge-vehicle battery to the work-vehicle battery at a level of at least 100 kW.

Clause 80. The method of clause 75, wherein the work vehicle and the recharge vehicle synchronously move while the electric power is transmitted from the recharge-vehicle battery to the work-vehicle battery such that the electrical connection between the work vehicle and the recharge vehicle remains intact.

DETAILED DESCRIPTION

Figure 1A:
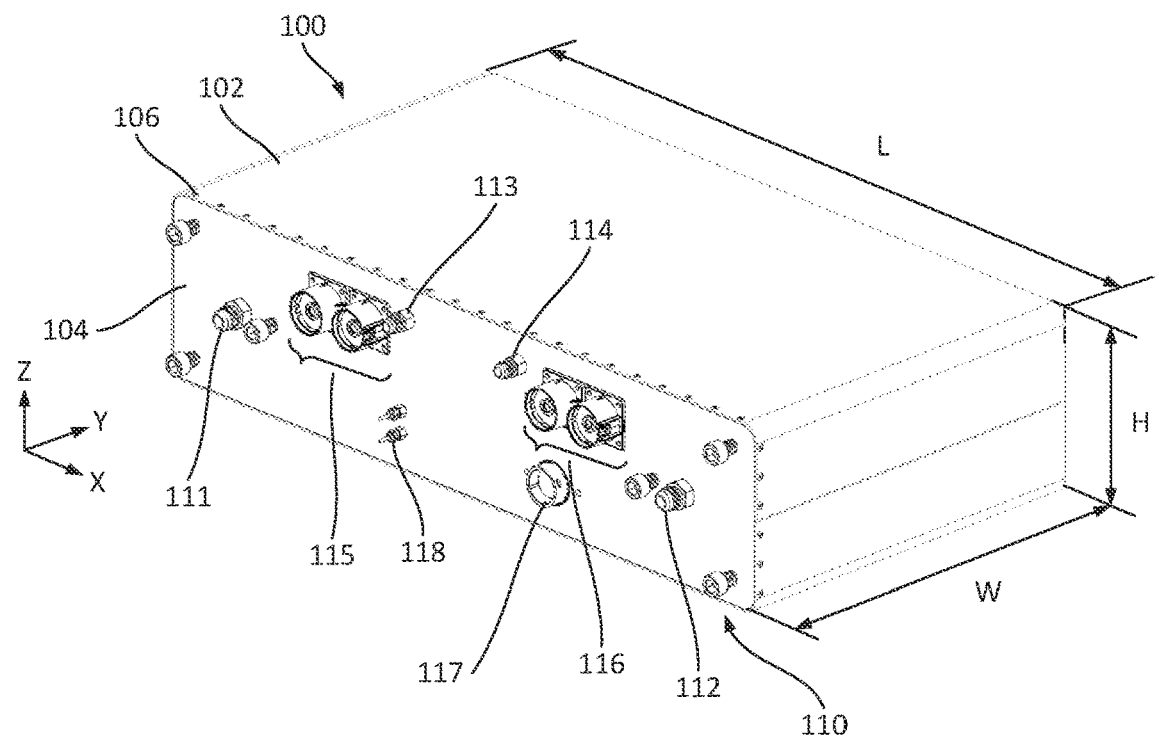
FIG. 1A is a schematic perspective view of a DC-DC converter illustrating an enclosure, a front plate, and various connectors provided on the front plate, in accordance with some examples.

In the following description, numerous specific details are outlined to provide a thorough understanding of the present invention. The present invention may be practiced without some or all of these specific details. In other instances, well-known process operations have not been described in detail to avoid obscuring the present invention. While the invention will be described in conjunction with the specific examples, it will be understood that it is not intended to limit the invention to the examples.

Introduction

As noted above, DC-DC converters are devices used to increase or decrease the DC voltage. Various types of DC-DC converters are within the scope. While the following description focuses on boost converters, many aspects apply to other types of converters. Furthermore, different applications of DC-DC converters are within the scope. In general, a boost converter steps up the input voltage to a higher output voltage (e.g., used to power a load with a voltage higher than the available input voltage). A buck converter steps down the input voltage to a lower output voltage (e.g., in battery-powered devices). A buck-boost converter can both step up and down voltage levels, making it versatile for applications with variable input voltages. A flyback converter can be used where galvanic isolation is needed between the input and output, such as in isolated power supplies and transformers. Additional examples include a Single-Ended Primary-Inductor Converter (SEPIC) and a Cuk converter.

A boost converter uses a switching module, a diode module, an inductor, and (in some examples), one or more capacitors. These components, especially, the switching module and the inductor are prone to generating significant amounts of heat (e.g., 1-2% of the total power) during the converter operation. This heat needs to be removed during this operation. Furthermore, packaging these components into a small enclosure while providing various cooling features can be challenging. For example, inductors together with any associated cooling units can represent a significant portion of a DC-DC converter's volume and weight, particularly in high-power applications (e.g., at or over 200 kW). Ideally, the weight and volume are minimized, e.g., especially for vehicle applications. In some examples, the reduction in volume/weight of the inductor can be achieved, in part, by increasing the switching frequency of the converter and/or utilizing an air core (e.g., higher switching frequencies allow smaller inductors that can utilize air cores). Air cores have the advantage of not saturating as a magnetic core would when driven hard enough. Alternatively, inductors can use magnetic cores. However, this approach increases the heat generation by the switching module, which also needs to be cooled. Another way of reducing the volume/weight is by providing immersed (integrated) cooling to inductor coils as described herein. Specifically, cooling units and methods described herein can be applied to various types of inductors (e.g., with air cores or magnetic cores. It should be noted that these cooling units and methods can also be applied to transformers having one or more secondary windings.

Referring to the inductor examples further described below, an inductor coil can be assembled using a metal sheet (e.g., metal foil) instead of conventional round wires. Metal sheets can provide various advantages (over round wires) such as size reduction, reduction in voltage stress between turns of the winding, and greater mechanical strength. Metal sheets can also be shaped to form periodic grooves, which when coiled with the insulator sheet form fluidic pathways. Specifically, these grooves provide cooling fluid pathways thereby enabling immersed liquid cooling to the inductor coil. These grooves/cooling fluid pathways are used to an inductor cooling fluid (e.g., a transformer oil) to remove the heat from the interior of the inductor coil. When multiple inductors are used in a DC-DC converter (e.g., as parts of two converter units operating anti-phase), the inductor cooling fluid is pumped through all inductors in a way that achieves uniform cooling.

In general, inductor losses (through heat generation) fall into two categories: (1) core losses and (2) copper losses.

Core losses include eddy currents, flux leakage, hysteresis, and core saturation. An air core inductor has no core losses when operated at high frequencies. Copper losses are caused by a combination of the DC and AC resistance of the inductor coil (sometimes referred to as I squared R losses) since the magnitude of the loss is proportional to the square of the electrical current. AC resistance is more complex since it involves the "skin effect" where the current flow tends to force electrons to flow on the outside of the wire/conductor, the skin depth dramatically decreases at higher frequencies (i.e., above 1 MHz). A sufficiently wide metal sheet/foil wound inductor will have a much larger surface area than conventional round wires thereby reducing AC losses when operating at high frequencies.

Examples of DC-DC Converters

FIG. 1A is a schematic perspective view of a DC-DC converter 100 illustrating an enclosure 102, a front plate 104, and connectors 110 provided on the front plate 104, in accordance with some examples. FIG. 1G is a corresponding block diagram of the DC-DC converter 100. Enclosure 102 can be attached and, in some examples, sealed to front plate 104 with a set of fasteners 106. Overall, the case of DC-DC converter 100, formed by enclosure 102 and front plate 104, can protect the internal components of DC-DC converter 100 from the environment (e.g., water, dirt). Such sealing aspects are particularly important for vehicle (e.g., farming vehicle) operations as further described below with reference to FIGS. 4A and 4B.

Connectors 110 provide various power, signal, and fluidic connections to various internal components of DC-DC converter 100. Some examples of these connectors 110 may include a first inductor-cooling coupler 111 and a second inductor-cooling coupler 112, which can be operable as an inlet and outlet (respectively) for inductor-cooling liquid 189 as further described below. For example, the first inductor-cooling coupler 111 and second inductor-cooling coupler 112 can be used for connecting to various external components, such as an external pump and an external heat exchanger (e.g., for pumping the inductor-cooling liquid 189 through the DC-DC converter 100 and for cooling (or heating) the inductor-cooling liquid 189 when this inductor-cooling liquid 189 is received from the DC-DC converter 100 and before being supplied back to the DC-DC converter 100.

Additional examples of connectors 110 include a first plate-cooling coupler 113 and a second plate-cooling coupler 114, which can be operable as an inlet and outlet for plate-cooling liquid 179 as further described below. For example, the first plate-cooling coupler 113 and second plate-cooling coupler 114 can be used for connecting to various external components, such as an external pump and an external heat exchanger (e.g., for pumping the plate-cooling liquid 179 through the DC-DC converter 100 and for cooling (or heating) the plate-cooling liquid 179 when this plate-cooling liquid 179 is received from the DC-DC converter 100 and before being supplied back to the DC-DC converter 100. In some examples, plate-cooling liquid 179 is different from inductor-cooling liquid 189 and uses different external components for pumping and cooling. For example, plate-cooling liquid 179 is electronically isolated from any current-carrying components and can be water-based liquid (e.g., with various lubrication and anti-freezing additives). On the other hand, inductor-cooling liquid 189 comes in direct contact (for immersion cooling) with the current-carrying components (e.g., coils of inductor 130 and additional inductor 131) and therefore needs to be electronically non-conductive, e.g., mineral oil, silicone oil, ester oil, and the like.

Further examples of connectors 110 include low-voltage connectors 115 (V in) and high-voltage connectors 116 (V out), harness opening 117 for feeding various sensors and control wires, and fiber-optic connectors 118 (e.g., for connecting fiber-optic control cables). For example, the low-voltage connectors 115 can be used for electrically connecting to a battery used for charging another battery, which is electrically connected to the low-voltage connectors 115.

In some examples, enclosure 102 has a length (L) of 400-1,000 millimeters, 500-800 millimeters, or 600-700 millimeters. Enclosure 102 may have a width (W) of 100-500 millimeters, 200-400 millimeters, or 300-375 millimeters. Furthermore, enclosure 102 may have a height (H) of 50-250 millimeters, 100-200 millimeters, or 120-180 millimeters. These dimensions ensure that DC-DC converter 100 can be used for various applications (e.g., electric vehicles) that require a small footprint. As such, the volume of enclosure 102 or, more generally, of DC-DC converter 100 can be less than 50 liters or even less than 45 liters. For example, the volume can be 20-50 liters or 30-40 liters. Even with such small sizes, the power rating of DC-DC converter 100 can be at least 100 kW, at least 150 kW, or even at least 200 kW. In some examples, the ratio of the power-rating output (P) of DC-DC converter 100 to the converter volume (V) is at least 2 kW per liter, at least 3 kW per liter, or even at least 4 kW per liter. Various packaging features described below enable such high power-to-volume ratios.

Figure 1B:
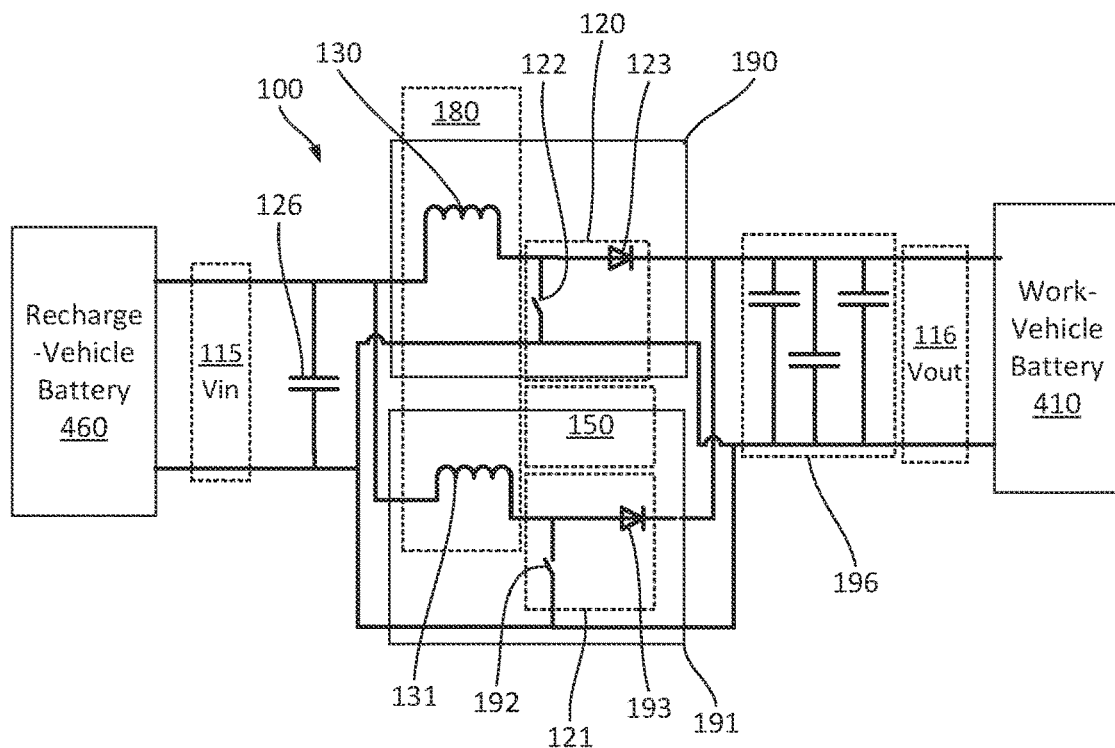
FIG. 1B is a schematic electric diagram of two converter units of the DC-DC converter such that these two converter units are configured to operate out of phase, in accordance with some examples.

Referring to FIG. 1B, in some examples, DC-DC converter 100 comprises converter unit 190 and additional converter unit 191. Using two smaller converter units rather than one large one helps to achieve more efficient packaging configurations. Furthermore, converter unit 190 and additional converter unit 191 can operate out of phase thereby reducing the voltage fluctuations and dependence on the capacitors. For example, DC-DC converter 100 comprises a set of low-voltage capacitors 126, connected in parallel to the low-voltage connectors 115. In some examples, the set of low-voltage capacitors 126 may include a single capacitor. DC-DC converter 100 comprises a set of high-voltage capacitors 196, connected in parallel to the high-voltage connectors 116. In some examples, the set of high-voltage capacitors 196 may include three capacitors connected in parallel with each other.

Overall, converter unit 190 and additional converter unit 191 are connected in parallel and are operable as boost converters. For example, FIG. 1B illustrates converter unit 190 and additional converter unit 191 being connected to a charging battery (e.g., a recharge-vehicle battery 460), at a low-voltage side, and also to a charged battery (e.g., a work-vehicle battery 410), at a high-voltage side. Additional aspects of these connections and the use of DC-DC converter 100 for battery charging are described below with reference to FIGS. 4A and 4B.

Referring to FIG. 1B, in some examples, converter unit 190 comprises inductor 130, switching sub-module 122, and a diode sub-module 123. Similarly, additional converter unit 191 comprises an additional inductor 131, additional switching sub-module 192, and additional diode sub-module 193. The operation of these units will now be described with reference to converter unit 190. In some examples, switching and diode sub-modules can be integrated into the same sub-module, e.g., switching sub-module.

As noted above, converter unit 190 is a boost converter, which can be also referred to as a step-up converter such that the input voltage (Vin) is lower than the desired output voltage (V out). Switching sub-module 122 is a core component, which can comprise a transistor (metal-oxide-semiconductor field-effect transistor) or an integrated circuit (IC) with a built-in switch. Switching sub-module 122 (and additional switching sub-module 192) is controlled by a pulse-width modulation (PWM) signal, which can be provided by a controller of DC-DC converter 100. Inductor 130 is connected in series with the input voltage (e.g., the charging battery) and switching sub-module 122 and stores energy as a magnetic field when the switching sub-module 122 is closed (allows the current to pass). A diode (of the diode sub-module 123) is connected in parallel with the output voltage (e.g., the charged battery) allowing the current to flow in only one direction. A set of low-voltage capacitors 126 can be used for "filtering" purposes since the voltage across capacitor 126 cannot change suddenly thereby reducing the "square wave" effect of the boost converter.

Specifically, when switching sub-module 122 is initially closed, the current flows through inductor 130 and stores energy in its magnetic field. The diode is reverse-biased at this point and blocks the current flow to the load. During this phase of converter unit 190, additional converter unit 191 may have its additional switching sub-module 192 open (i.e., operating out of phase). After a certain period (determined by the PWM signal), switching sub-module 122 is opened. The current in inductor 130 cannot instantaneously stop the current flow. As such, the current continues to flow through the diode sub-module 123 to the load. Overall, the energy stored in the inductor's magnetic field is transferred to the load thereby causing the output voltage (V out) to be higher than the input voltage (Vin).

Referring to FIG. 1B, the switching sub-module 122 and the diode sub-module 123 (and optionally other components) can arranged into power electronic module 120. Inductor 130 and any capacitors can be positioned away from power electronic module 120. Similarly, additional switching sub-module 192 and additional diode sub-module 193 (and optionally other components) can arranged into additional power electronic module 121. Power electronic module 120 and additional power electronic module 121 can be cooled using electronic module cooling unit 150 as further described below. Inductor 130 and additional inductor 131 can be parts of inductor cooling system 180, which are designed to cool the coils of these inductors as further described below.

Figure 1C:
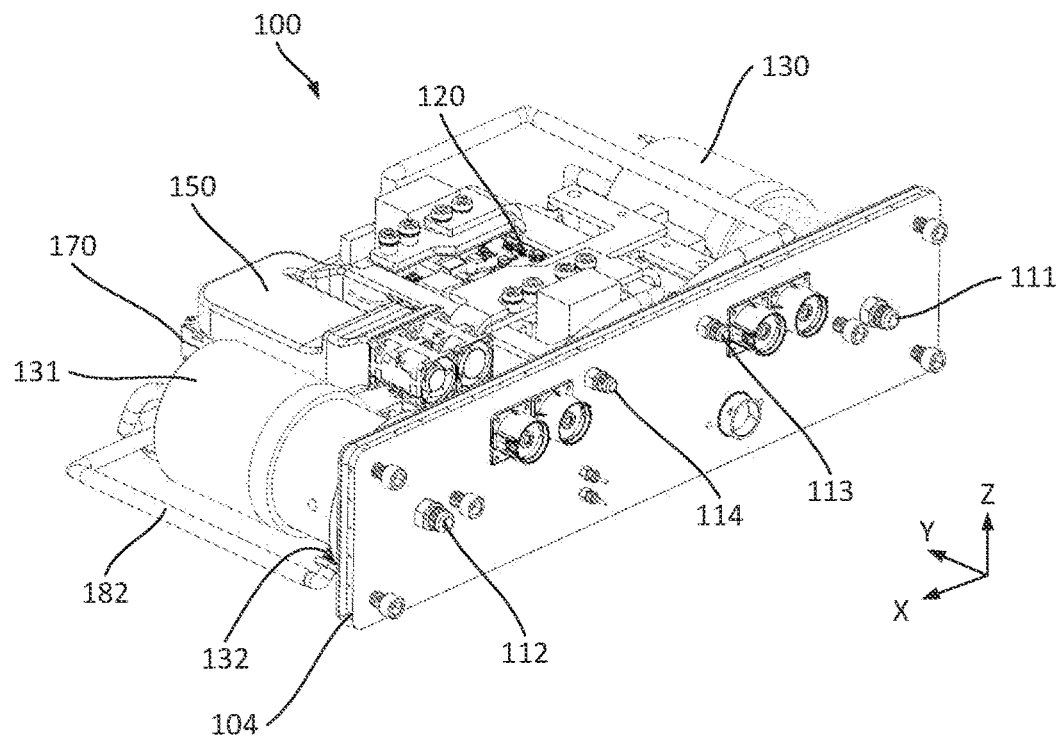
FIGS. 1C and 1D are two schematic perspective views of the DC-DC converter in FIG. 1A with the enclosure removed, illustrating various internal components of the DC-DC converter, in accordance with some examples.
Figure 1D:
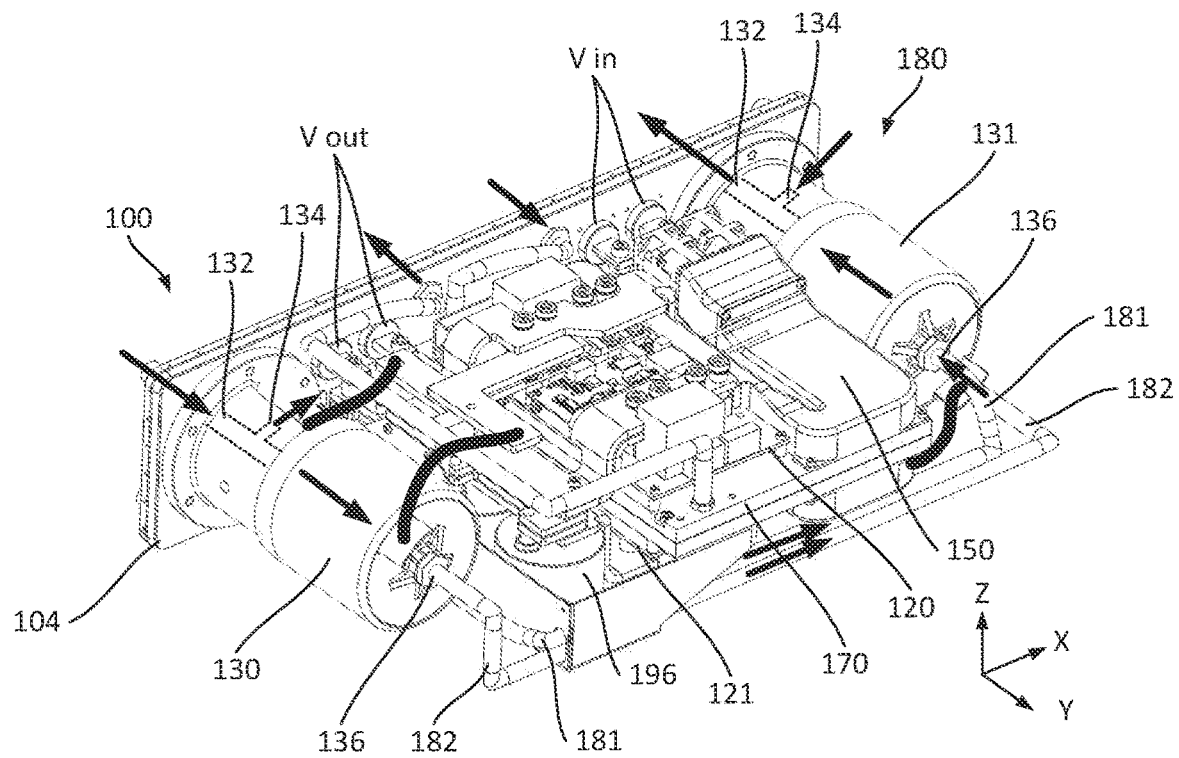

FIGS. 1C and 1D are two schematic perspective views of DC-DC converter 100 in FIG. 1A with enclosure 102 being removed, illustrating various internal components. Specifically, FIGS. 1C and 1D illustrate the packaging of these components that enable such high power-to-volume ratios. The center of DC-DC converter 100 can be occupied by a stack formed by power electronic module 120, cooling plate 170, and additional power electronic module 121. The cooling plate 170 is a part of the electronic module cooling unit 150, which includes various other components providing air-cooling to both power electronic modules. Cooling plate 170 is positioned between and thermally coupled to each of the power electronic module 120 and additional power electronic module 121.

The stack of the power electronic module 120, the cooling plate 170, and the additional power electronic module 121 is positioned between the inductor 130 and the additional inductor 131. More specifically, a set of high-voltage capacitors 196 is positioned between the inductor 130 and the stack of the power electronic module 120, the cooling plate 170, and the additional power electronic module 121. The set of low-voltage capacitors 126 (not visible in FIG. 1D) can be positioned between various parts of this stack (within the boundaries of the stack).

The electrical connections between various components of the DC-DC converter 100 can be provided by various bus bars and/or flexible wires (e.g., as shown between the bus bars and the connectors of the inductor 130 in FIG. 1D). Some electrical connections can be formed through the power electronic module 120 and the additional power electronic module 121, parts of which can be in the form of printed circuit boards (PCBs).

FIG. 1D also illustrates various fluidic connections between the inductor 130 and the additional inductor 131, e.g., using first fluid connection 181 and second fluid connection 182. Additional aspects of these connections and the flow of inductor-cooling liquid 189 (shown with arrows in FIG. 1D) through inductor 130 and additional inductor 131 are described below.

Figure 1E:
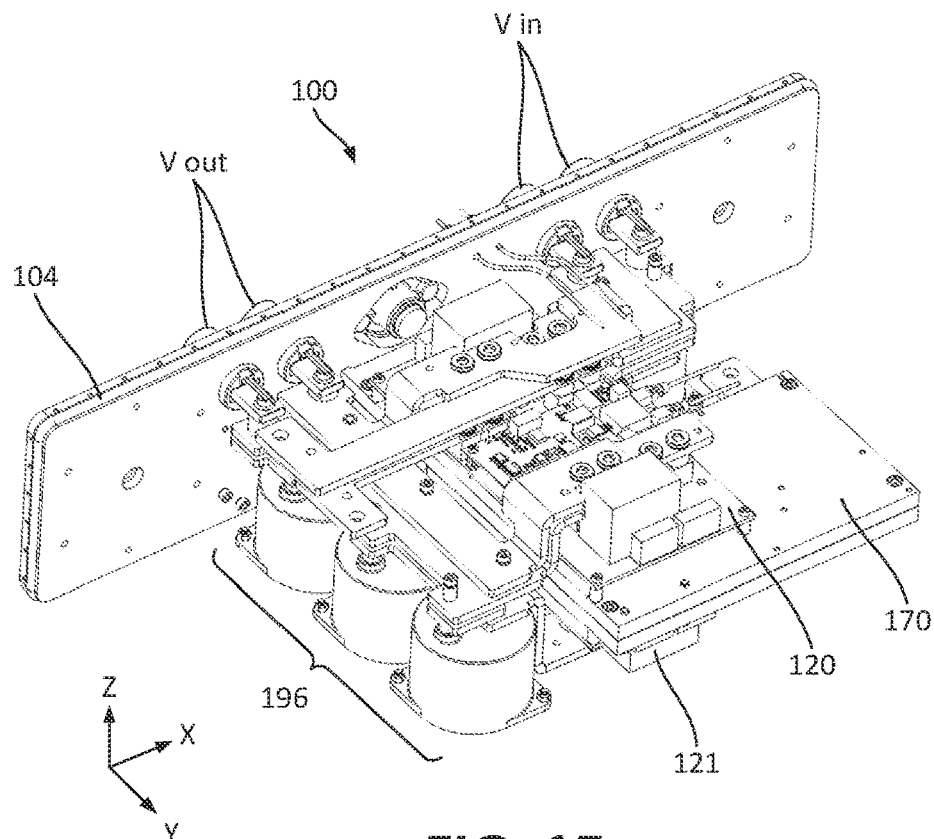
FIGS. 1E and 1F are two additional schematic perspective views of the DC-DC converter in FIG. 1A with the enclosure, inductors, and electronic module cooling units not shown, illustrating various electrical connections of the DC-DC converter, in accordance with some examples.
Figure 1F:
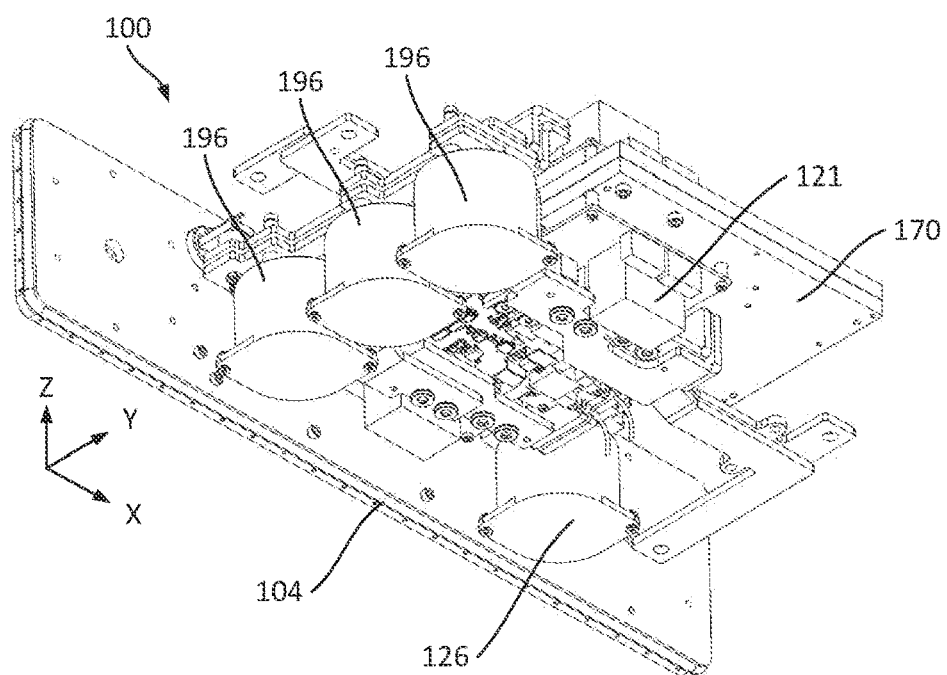
Figure 1G:
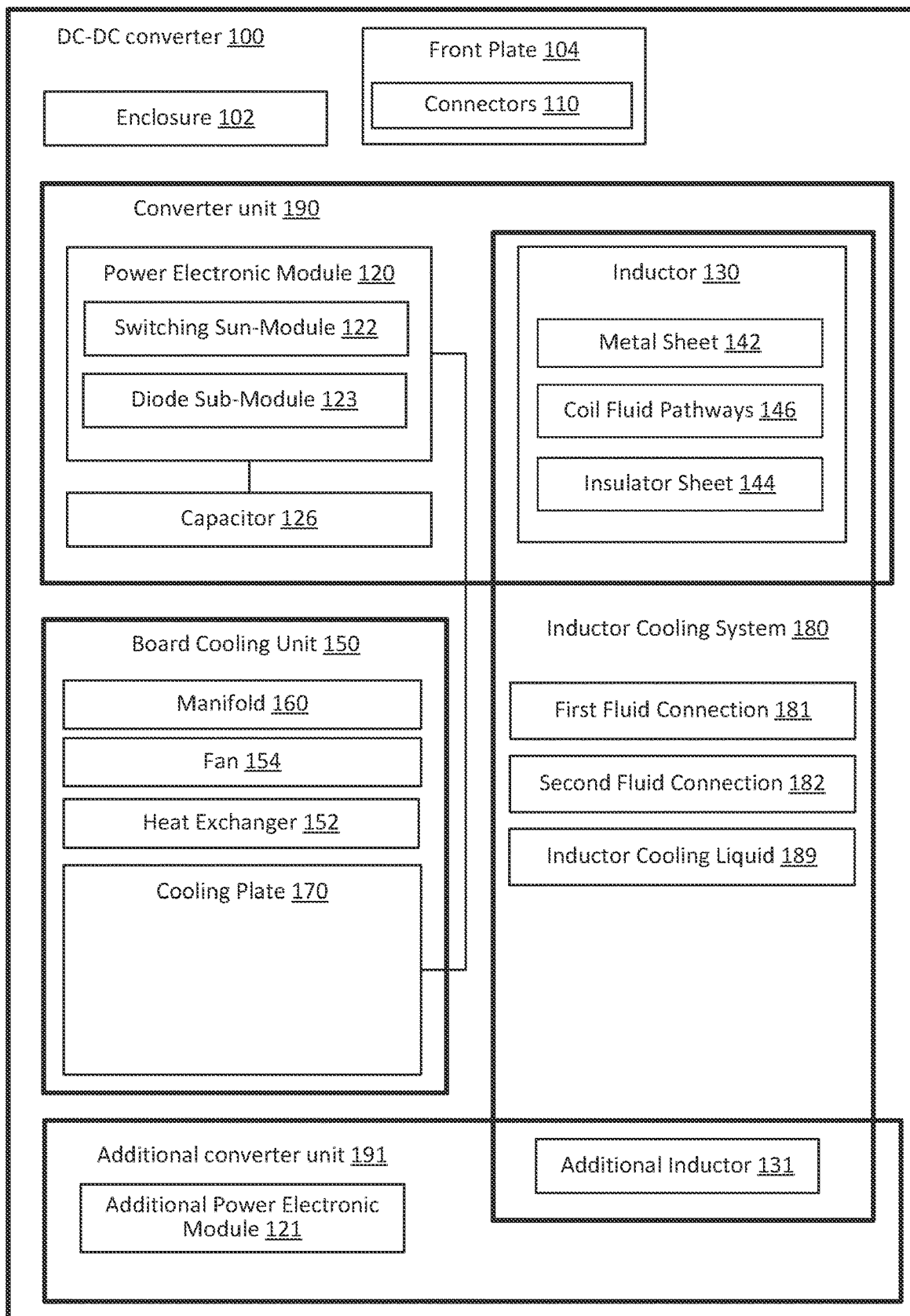
FIG. 1G is a block diagram of a DC-DC converter illustrating various components of the converter, in accordance with some examples.

FIGS. 1E and 1F are two additional schematic perspective views of the DC-DC converter 100 in FIG. 1A with the enclosure, inductors, and electronic module cooling units not shown, illustrating various electrical connections of DC-DC converter 100, in accordance with some examples.

Examples of Electronic Module Cooling Units

Figure 2A:
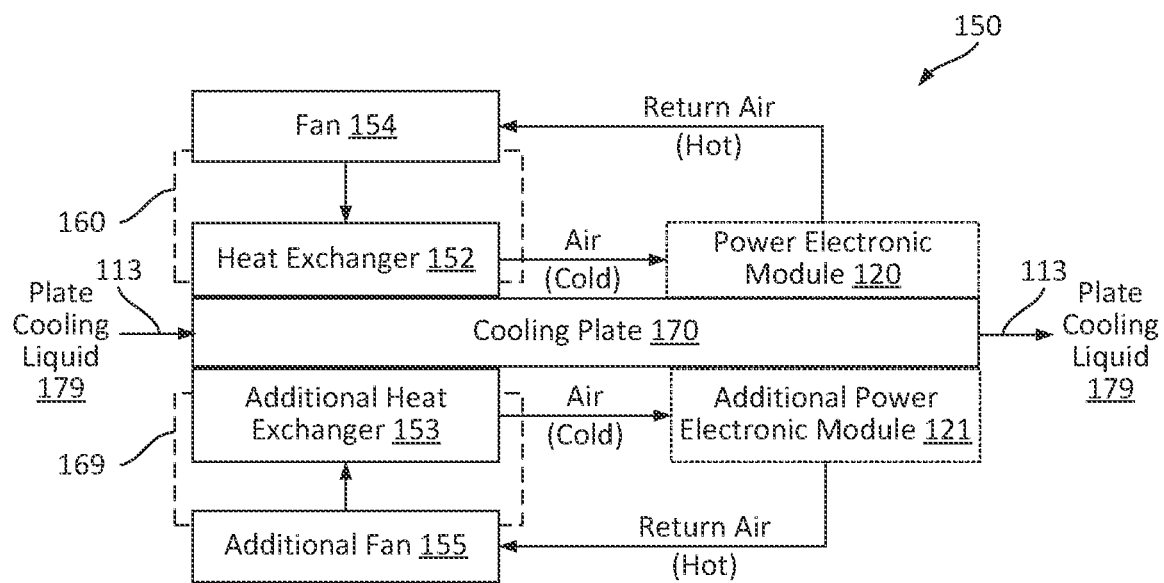
FIG. 2A is a block diagram of the electronic module cooling unit illustrating various components of the unit as well the airflow and the flow of the plate cooling liquid through a cooling plate of the unit, in accordance with some examples.

FIG. 2A is a block diagram of electronic module cooling unit 150 illustrating various components of the unit as well as the airflow and the flow of plate-cooling liquid 179 through the unit's cooling plate 170, in accordance with some examples. Electronic module cooling unit 150 is used for cooling the power electronic module 120 of DC-DC converter 100. In some examples, the DC-DC converter 100 comprises an additional power electronic module 121, in which case, the electronic module cooling unit 150 is also used for cooling this additional power electronic module 121. Some components of the electronic module cooling unit 150 are used to cool both of the power electronic modules. Other components are dedicated to cooling the specific power electronic module.

As noted above, a DC-DC converter 100 can comprise converter unit 190 and additional converter unit 191, e.g., operating out of phase. The converter unit 190 comprises a power electronic module 120 (in addition to an inductor 130), which in turn comprises switching sub-module 122 and diode sub-module 123. Additional converter unit 191 comprises an additional power electronic module 121 (and an additional inductor 131). The designs of the converter units and, more specifically, the design of the power electronic modules can be substantially the same. The power electronic module 120 and the additional power electronic module 121 may be stacked along the height of the DC-DC converter 100 (the Z-axis) thereby reducing the footprint and the volume of the DC-DC converter 100. Cooling plate 170 can be a part of this stack, positioned between and thermally coupled to each of the power electronic module 120 and the additional power electronic module 121.

Figure 2B:
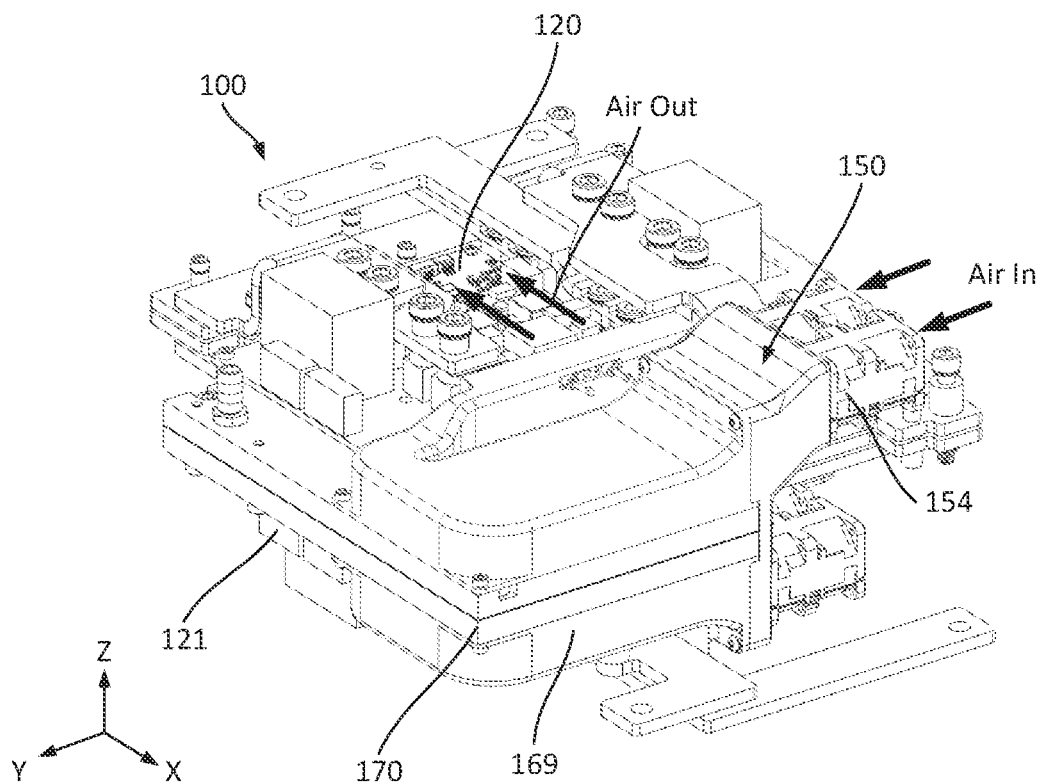
FIG. 2B is a schematic perspective view of a portion of the DC-DC converter in FIG. 1A illustrating various components of the electronic module cooling unit, in accordance with some examples.
Figure 2C:
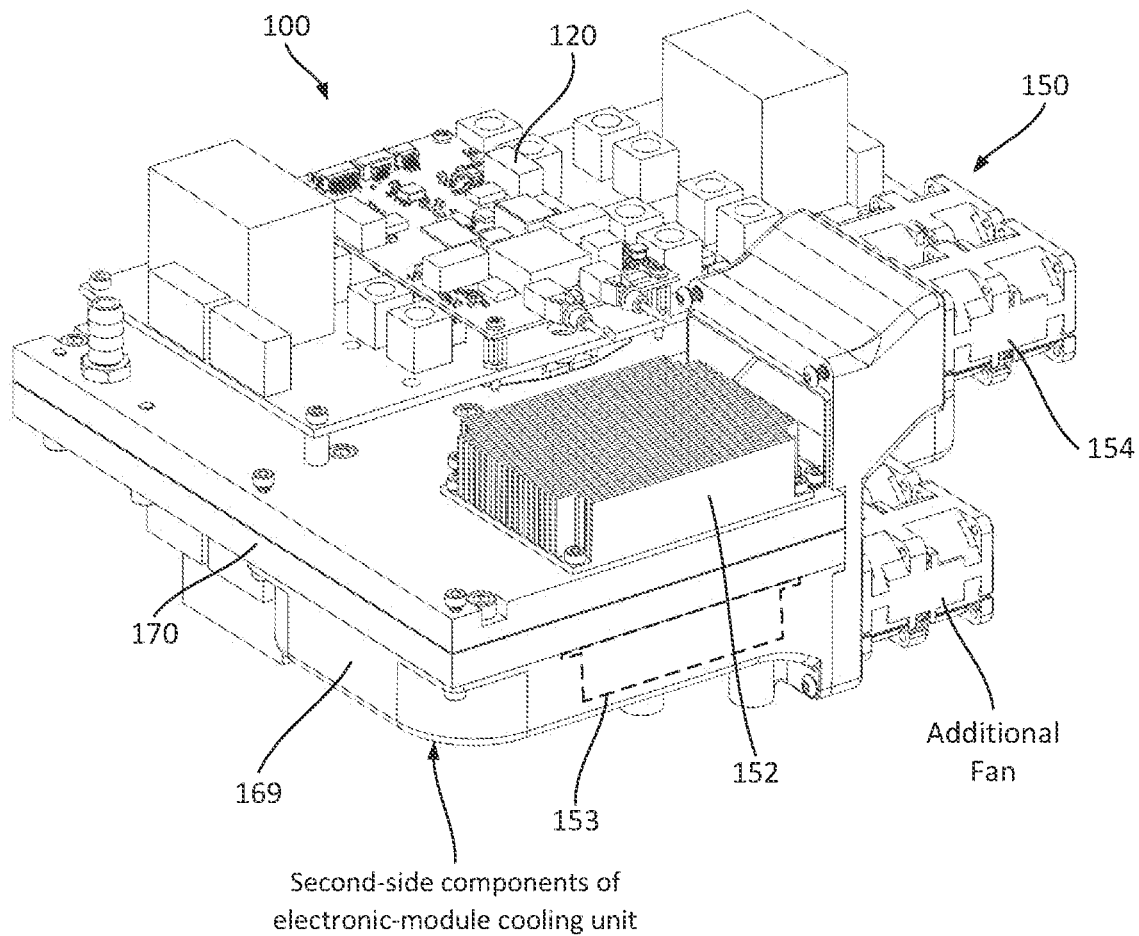
FIG. 2C is a schematic perspective view of a portion of the DC-DC converter in FIG. 1A with a manifold of the electronic module cooling unit removed illustrating the position of the heat exchanger 152 relative to the cooling plate, in accordance with some examples.
Figure 2D:
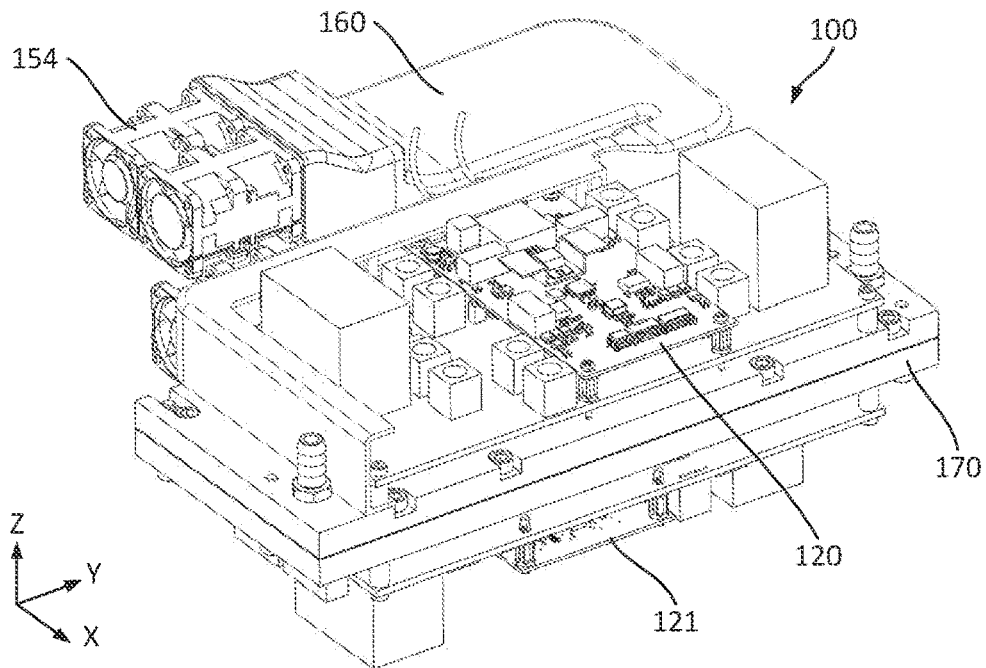
FIG. 2D is another schematic perspective view of a portion of the DC-DC converter in FIG. 1A illustrating various components of the electronic module cooling unit, in accordance with some examples.

Referring to FIGS. 2A-2C, electronic module cooling unit 150 comprises a heat exchanger 152, a fan 154, a manifold 160, and a cooling plate 170. When the DC-DC converter 100 comprises an additional power electronic module 121, electronic module cooling unit 150 can also comprise an additional heat exchanger 153, an additional fan 155, and an additional manifold 169. Cooling plate 170 is thermally coupled to the heat exchanger 152 (and to the additional heat exchanger 153, if present) and to at least a portion of the power electronic module 120 (and to the additional power electronic module 121 is present). A combination of the heat exchanger 152, the fan 154, and the manifold 160 can be referred to as an electronic module cooling sub-unit, while a combination of the additional heat exchanger 153, the additional fan 155, and the additional manifold 169 can be referred to as an additional electronic module cooling sub-unit. The electronic module cooling sub-unit and the additional electronic module cooling sub-unit share the same cooling plate 170. The design of the electronic module cooling sub-unit and the design of the additional electronic module cooling sub-unit can be the same. As such, any description of the electronic module cooling sub-unit presented below also applies to the additional electronic module cooling sub-unit, unless specifically noted.

Figure 2E:
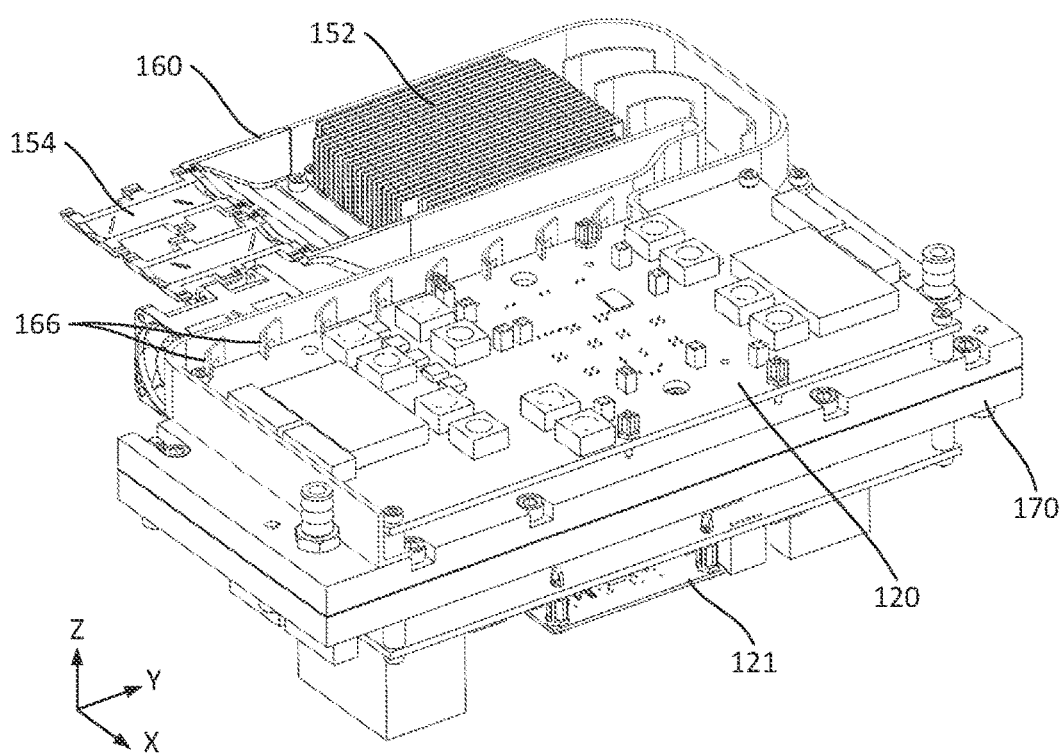
FIG. 2E is another perspective cross-sectional view of a portion of the DC-DC converter in FIG. 1A illustrating various components of the electronic module cooling unit, in accordance with some examples.

Referring to FIGS. 2A-2F and, more specifically, to FIG. 2E, in some examples, the manifold 160 encloses the heat exchanger 152 and is configured to direct the air from the fan 154 to the power electronic module 120. It should be noted that the air is re-circulated by fan 154 within enclosure 102 of the DC-DC converter 100. In other words, the external air is not directed into enclosure 102 thereby preserving the sealing aspects of enclosure 102. The re-circulated air is heated by the power electronic module 120 (thereby cooling the power electronic module 120) and is cooled by the heat exchanger 152 (which transfers the heat to the plate-cooling liquid 179, which is pumped in and out of the enclosure 102 (through the first plate-cooling coupler 113 and the second plate-cooling coupler 114) and is cooled externally.

Referring to FIG. 2E, in some examples, the manifold 160 comprises flow distributors 166, evenly distributed along the edge of the power electronic module 120. Specifically, flow distributors 166 may be spaced or angled to provide different airflow to specific areas of the power electronic module for localized cooling. For example, after passing through heat exchanger 152, the cool air may be turned and flown in the direction opposite of the Y-axis. Upon reaching the flow distributors 166, the air may be diverted to flow along the X-axis and toward the power electronic module 120. The distribution and the shape of the flow distributors 166 may be such that the air flows substantially uniformly passed the power electronic module 120.

Referring to FIG. 2E, in some examples, each flow distributor 166 has a slit such that the power electronic module 120 protrudes into the slit. In other words, different parts of the flow distributor 166 (separated by the slit) extend on the opposite sides of the power electronic module 120. As such, the flow distributor 166 can provide the airflow on the opposite sides of the power electronic module 120 thereby enhancing the cooling of the power electronic module 120. It should be noted that one side of the power electronic module 120 faces the cooling plate 170. As such, the air flowing between the power electronic module 120 and the cooling plate 170 may additionally cool from the cooling plate 170. Furthermore, some components (e.g., switching sub-module 122) of the power electronic module 120 may extend and form a direct contact and thermal coupling with the cooling plate 170.

Figure 2F:
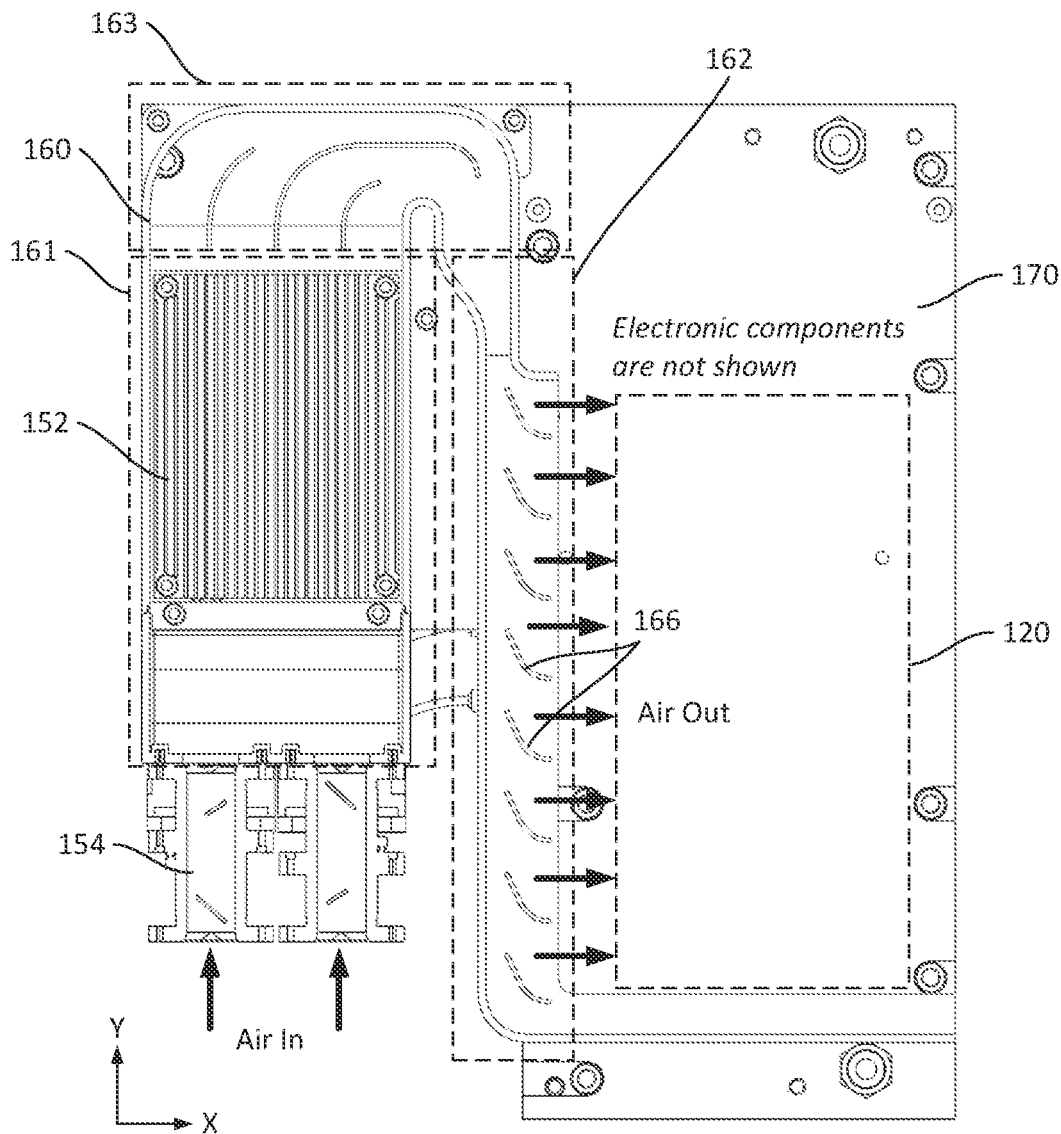
FIG. 2F is another planar cross-sectional view of a portion of the DC-DC converter in FIG. 1A illustrating various components of the electronic module cooling unit, in accordance with some examples.

Referring to FIG. 2F, in some examples, manifold 160 comprises a first manifold portion 161, a second manifold portion 162, and a turn portion 163 such that turn portion 163 interconnects first manifold portion 161 and second manifold portion 162. The first manifold portion 161 and second manifold portion 162 are configured to flow air in opposite directions (e.g., in the direction of the Y-axis in the first manifold portion 161 and in the opposite direction in the second manifold portion 162). As shown in FIG. 2F, heat exchanger 152 is positioned within the first manifold portion 161. The flow distributors 166 are positioned within the second manifold portion 162. Turn portion 163 comprises a set of structures for separating and turning the airflow. Specifically, these structures may be configured to reduce turbulence.

Referring to FIGS. 2C, 2E, and 2F, in some examples, heat exchanger 152 comprises a set of metal ridges/fins extending parallel to each other and away from the cooling plate 170. These ridges/fins increase the surface area of the heat exchanger 152 contacting the air as the air passes through the heat exchanger 152. As noted above, the heat exchanger 152 is thermally coupled to the cooling plate 170. For example, the 152 may include a base that is bolted to and directly interfacing with the cooling plate 170.

Figure 2G:
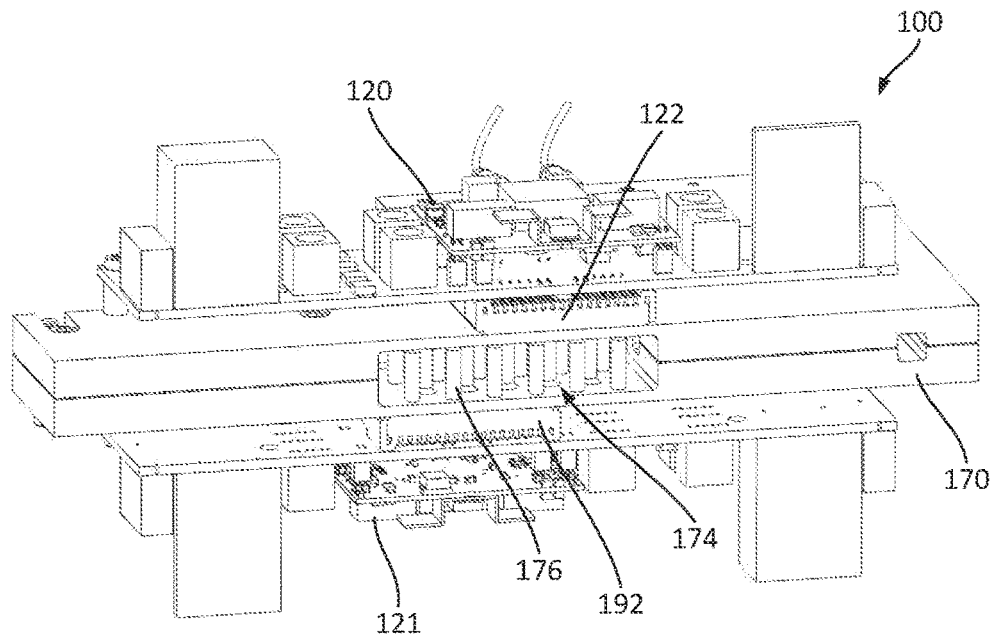
FIG. 2G is yet another perspective cross-sectional view of a portion of the DC-DC converter in FG. 1A illustrating various internal features of the cooling plate, in accordance with some examples.
Figure 2H:
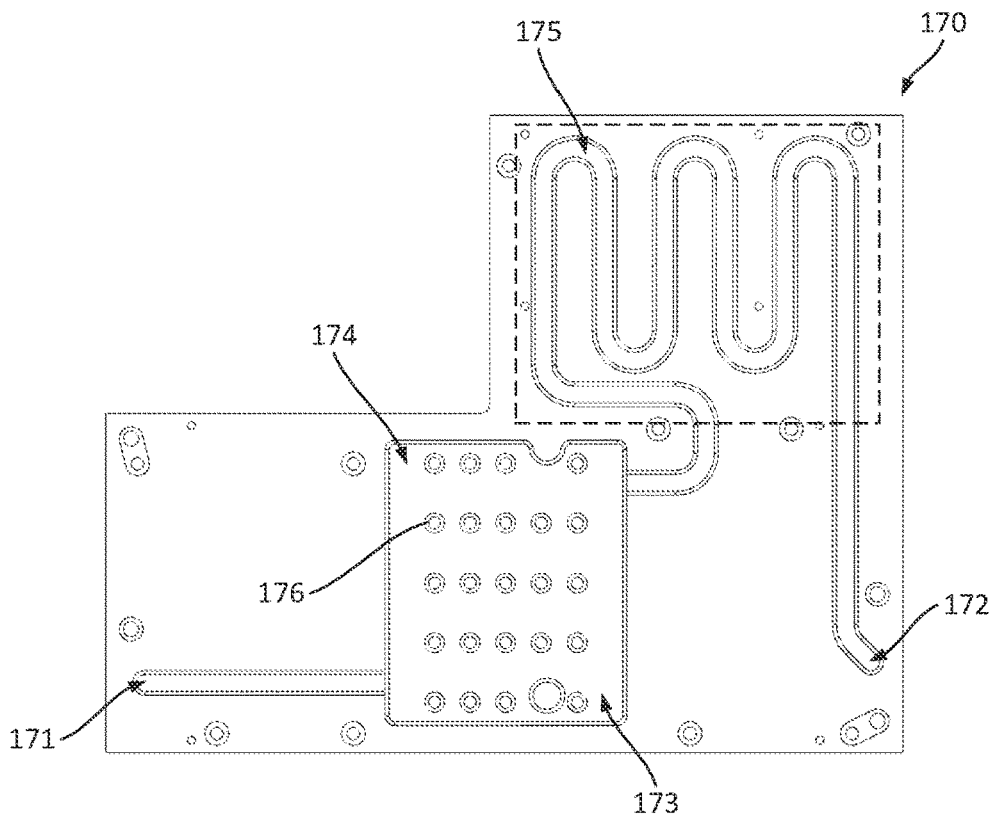
FIG. 2H is a planar cross-sectional view of the cooling plate illustrating various internal features of the cooling plate, in accordance with some examples.

Referring to FIGS. 2G and 2H, in some examples, cooling plate 170 comprises an interior cavity 173, extending between the cavity inlet 171 and cavity outlet 172 and configured to flow plate-cooling liquid 179 through cooling plate 170 between cavity inlet 171 and cavity outlet 172. Cavity inlet 171 may be fluidically coupled to the first plate-cooling coupler 113, while cavity outlet 172 may be fluidically coupled to the second plate-cooling coupler 114. As noted above, each of the first plate-cooling coupler 113 and second plate-cooling coupler 114 protrudes through and is supported by front plate 104. In some examples (not shown), both cavity inlet 171 and cavity outlet 172 are positioned along an edge of cooling plate 170 proximate to the front plate 104.

Referring to FIGS. 2G and 2H, in some examples, the interior cavity 173 comprises an electronic module-aligned cavity portion 174. The projection of the power electronic module 120 (and the additional power electronic module 121 when present), e.g., a switching sub-module 122, overlaps with an electronic module-aligned cavity portion 174. As such, the electronic module-aligned cavity portion 174 is used to transfer the heat from the power electronic module 120, e.g., through the wall of the cooling plate 170 facing the power electronic module 120. Overall, the heat transfer path between the power electronic module 120 and the plate-cooling liquid 179 is minimized by virtue of this electronic module-aligned cavity portion 174.

Referring to FIGS. 2G and 2H, in some examples, cooling plate 170 comprises cavity studs 176 that extend through electronic module-aligned cavity portion 174 between the opposite walls of cooling plate 170. These cavity studs 176 increase the contact area between the plate cooling liquid 179 and the cooling plate 170 such that the thermal coupling is increased. Furthermore, the cavity studs 176 may be configured to create turbulence within the plate-cooling liquid 179 while the plate-cooling liquid 179 passes through the electronic module-aligned cavity portion 174 thereby enhancing the heat transfer from the cooling plate 170 to the plate-cooling liquid 179.

Referring to FIG. 2G, in some examples, the electronic module-aligned cavity portion 174 is aligned with the thermal pads of one or more switches (of the switching sub-module 122 in the power electronic module 120) and one or more additional switches (in the additional power electronic module 121). In the same or other examples, the electronic module-aligned cavity portion 174 is aligned with the thermal pads of one or more diodes (of the diode sub-module 123 in the power electronic module 120) and one or more additional diodes (in the additional power electronic module 121). In some examples, a thermal-transfer compound having high thermal conductivity is placed between the cooling plate 170 and various components of the power electronic module 120 and/or the additional power electronic module 121 to increase thermal coupling.

Referring to FIG. 2H, in some examples, the interior cavity 173 comprises a heat-exchanger-aligned cavity portion 175, e.g., formed by a serpentine-shaped channel. The projection of the heat exchanger 152 (and the additional heat exchanger 153, if present) overlaps with the heat-exchanger-aligned cavity portion 175. As such, the heat-exchanger-aligned cavity portion 175 is used to transfer the heat from the heat exchanger 152, e.g., through the wall of the cooling plate 170 facing the power electronic module 120. Overall, the heat transfer path between the heat exchanger 152 and the plate-cooling liquid 179 is minimized by this heat-exchanger-aligned cavity portion 175.

Referring to FIG. 1D, in some examples, DC-DC converter 100 further comprises an inductor 130 and an additional inductor 131. Power electronic module 120 is electrically connected to inductor 130. Additional power electronic module 121 is electrically connected to additional inductor 131. Cooling plate 170 extends between the inductor 130 and the additional inductor 131 (along the X-axis). Furthermore, both the power electronic module 120 and the additional power electronic module 121 are positioned between the inductor 130 and the additional inductor 131 (along the Z-axis). Furthermore, in some examples, various components of the electronic module cooling unit 150 (except the cooling plate 170) are positioned between the power electronic module 120 and additional inductor 131 (along the Z-axis). This arrangement of the components ensures a very compact design of the DC-DC converter 100.

Referring to FIG. 1A, in some examples, DC-DC converter 100 further comprises front plate 104, first inductor-cooling coupler 111, second inductor-cooling coupler 112, first plate-cooling coupler 113, and second plate-cooling coupler 114. Each of the first inductor-cooling coupler 111, second inductor-cooling coupler 112, first plate-cooling coupler 113, and second plate-cooling coupler 114, protrudes through and is supported by front plate 104. Each of the first inductor-cooling coupler 111 and the second inductor-cooling coupler 112 are fluidically coupled to inductor 130 and additional inductor 131. Each of the first plate-cooling coupler 113 and second plate-cooling coupler 114 is fluidically coupled to the cooling plate 170. The cooling plate 170 is fluidically isolated from inductor 130 and additional inductor 131.

In some examples, the temperature of power electronic module 120 is monitored, e.g., using an onboard converter controller. For example, the speed of fan 154 can be adjusted based on the temperature of the power electronic module 120. Such that the temperature of the power electronic module is kept substantially constant or prevented from exceeding temperature limits. Furthermore, the temperature of the power electronic module 120 can be transmitted to a remote unit, e.g., used for cooling and/or pumping the plate-cooling liquid 179. In these examples, the volumetric flow rate of plate cooling liquid 179 through cooling plate 170 can be adjusted based on the temperature of the cooling plate 170. Furthermore, the temperature of the plate-cooling liquid 179 can be monitored upon entering and/or exiting the cooling plate 170. This information can be used to determine the total heat removed from the power electronic module 120 and the additional power electronic module 121.

In yet other examples, the duty cycle or the power output of the DC-DC converter 100 is adjusted based on the temperature of the power electronic module 120, the temperature of plate-cooling liquid 179, and/or the temperature of the cooling plate 170 (e.g., the temperature of the electronic module-aligned cavity portion 174). Monitoring this temperature ensures that the operation temperature of the power electronics (e.g., switching sub-module 122, additional switching sub-module 192, diode sub-module 123, and additional diode sub-module 193) are kept at safe operating temperatures.

Examples of Inductor Cooling Units

Figure 3A:
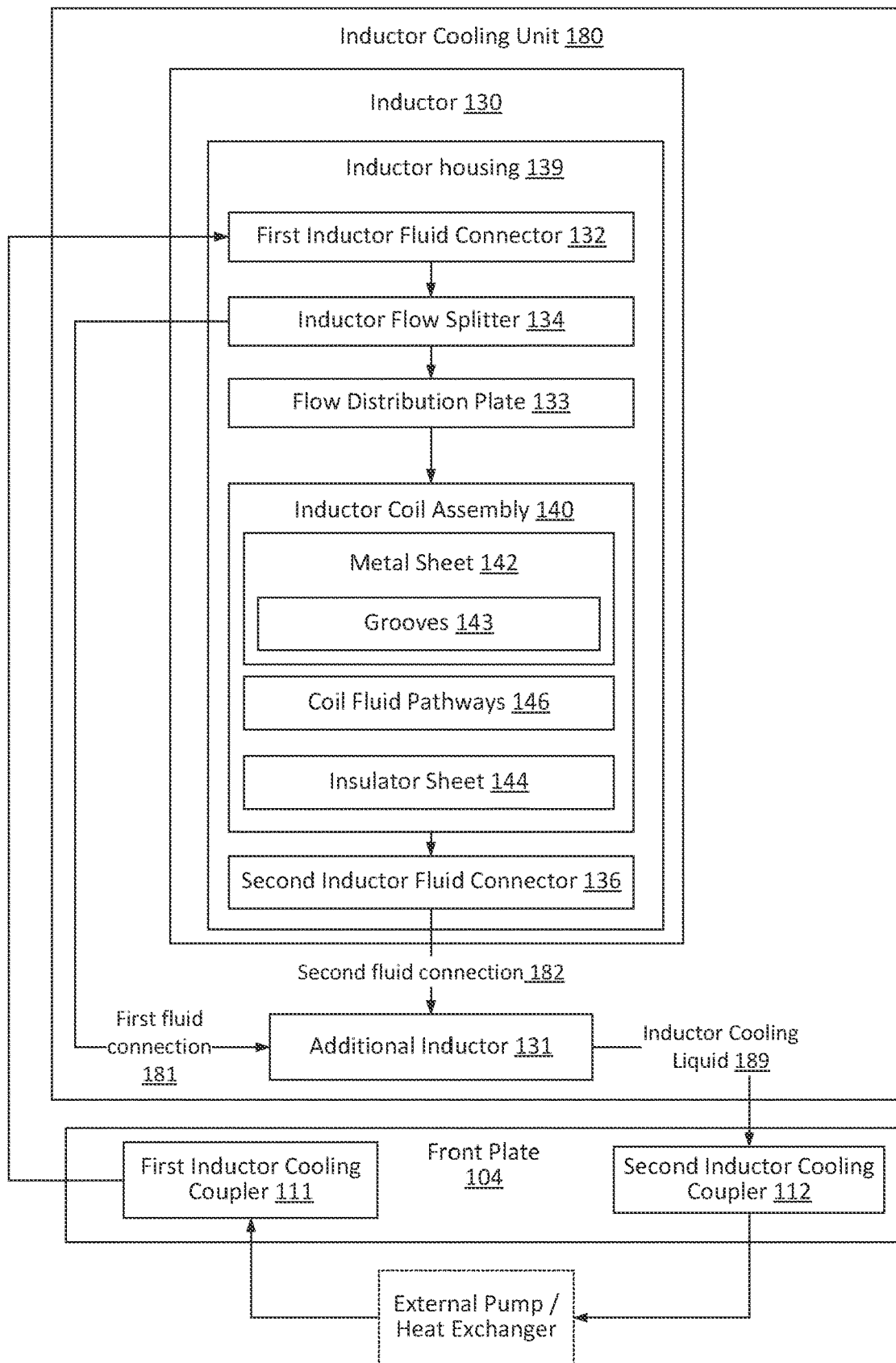
FIG. 3A is a block diagram of an inductor cooling unit illustrating various components of the unit as well as the flow of the inductor cooling liquid through coil fluid pathways, in accordance with some examples.
Figure 3B:
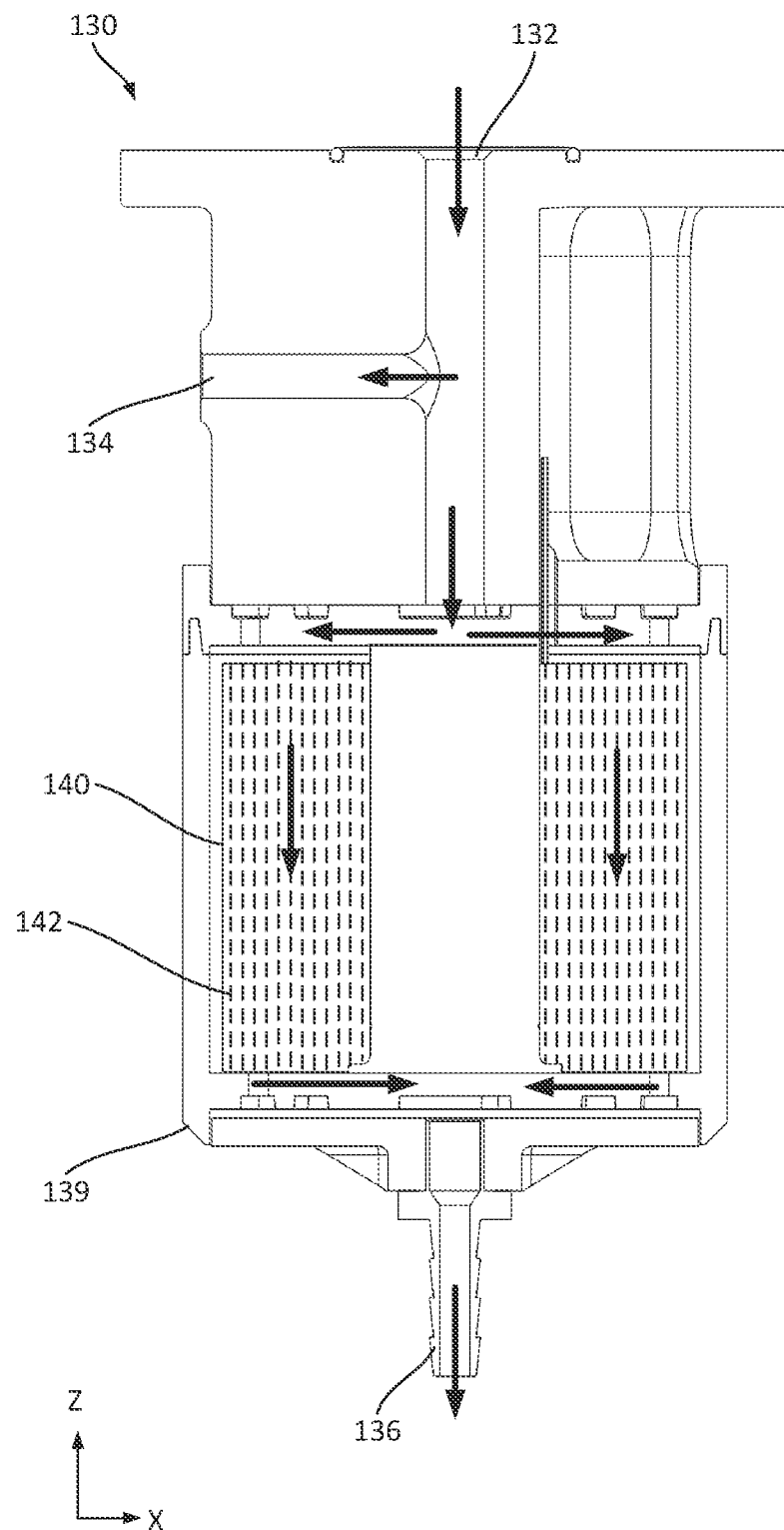
FIG. 3B is a schematic cross-sectional view of the inductor coil assembly illustrating various internal components and the flow of the inductor cooling liquid, in accordance with some examples.
Figure 3C:
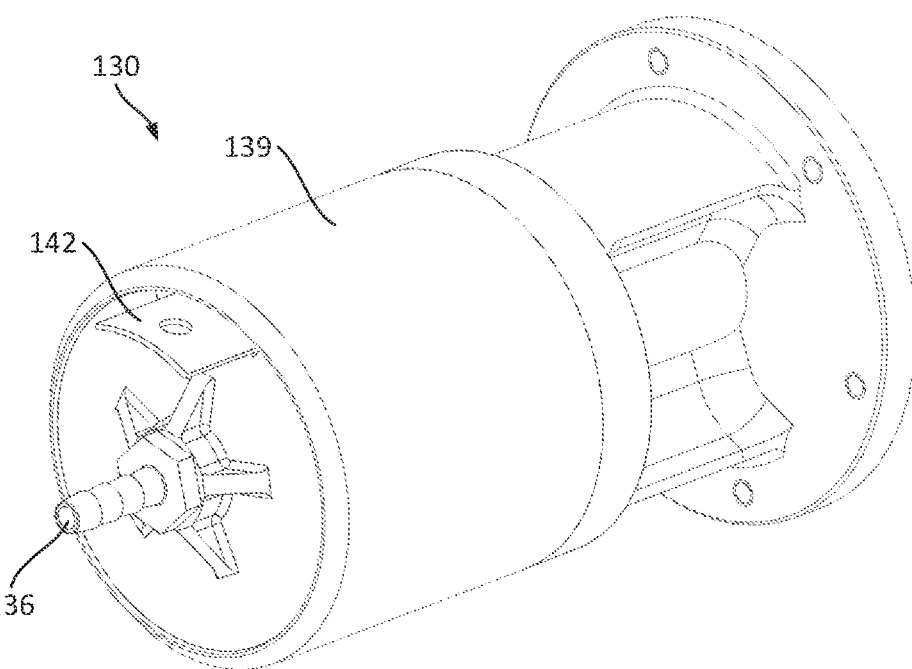
FIGS. 3C and 3D are two schematic perspective views of the inductor coil assembly illustrating the fluid connectors, in accordance with some examples.
Figure 3D:
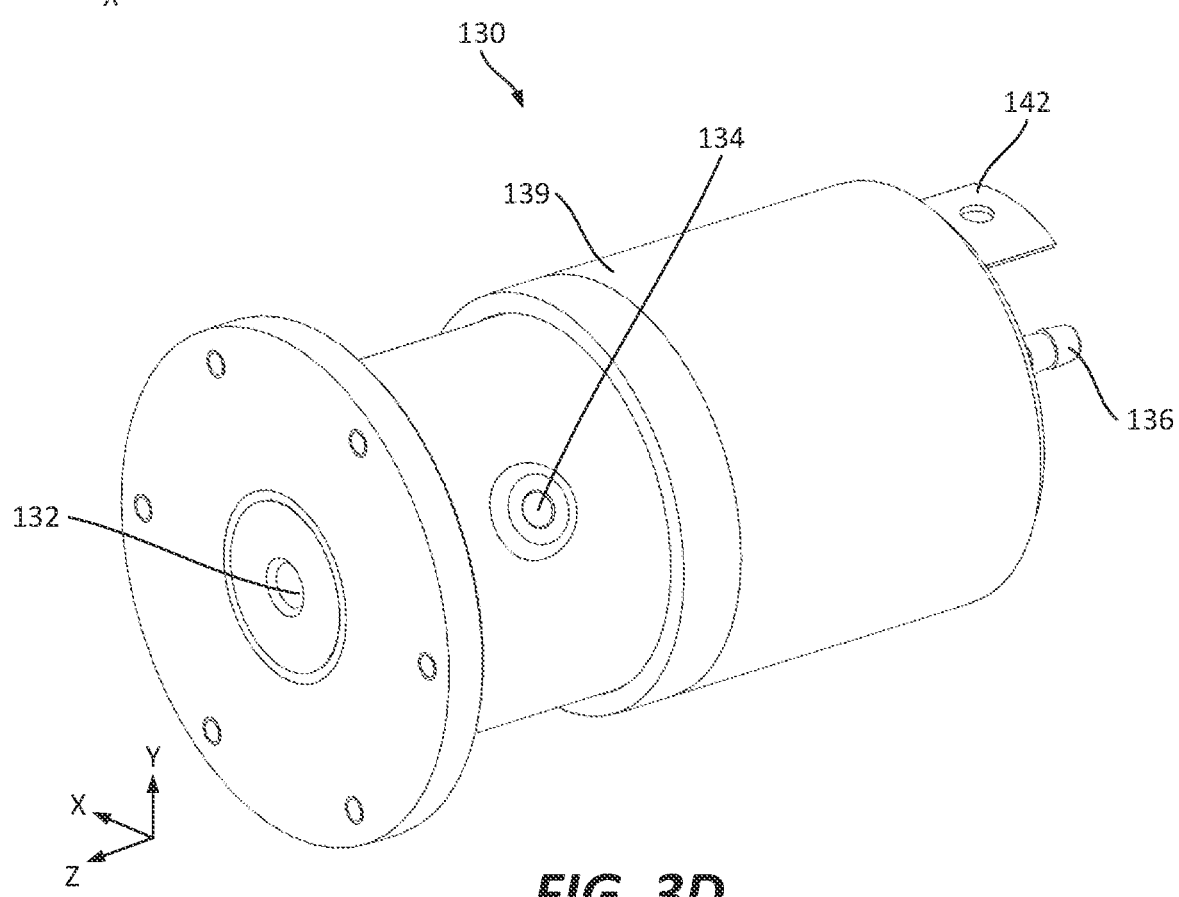

FIG. 3A is a block diagram of inductor cooling system 180 illustrating various components of inductor cooling system 180 as well as the flow of the inductor-cooling liquid 189 through these components, in accordance with some examples. Inductor cooling system 180 comprises an inductor 130 and, in some examples, an additional inductor 131 (e.g., when the DC-DC converter 100 comprises an additional converter unit 191). The reasons for using the converter units are described above. Inductor cooling system 180 may also comprise first fluid connection 181 and second fluid connection 182, which are used to interconnect the inductor 130 and additional inductor 131 with each other and with external components that supply/receive the inductor-cooling liquid 189 from the DC-DC converter 100 as further described below. Inductor 130 and additional inductor 131 may have the same design and components. As such, any description of inductor 130 presented below also applies to the additional inductor 131 unless specifically noted (e.g., the connection of the inductor 130 and the additional inductor 131 to the first fluid connection 181, the second fluid connection 182, and the couplers on the front plate 104). For example, the flow of inductor-cooling liquid 189 through inductor 130 and additional inductor 131 may be in opposite directions, e.g., as schematically shown in FIG. 1D.

Inductor 130 and additional inductor 131 (when present) are parts of inductor cooling system 180 and are interconnected as described below. Specifically, the inductor-cooling liquid 189 flows through these inductors and directly interfaces with the inductor coils, for cooling these coils. As such, these inductors may be referred to as immersion-cooled inductors. As further described below, the inductors have various features that enable the flow of the 189 through the inductors and the immersion-cooling aspects.

Referring to FIGS. 3A-3D, in some examples, inductor 130 comprises a liquid-tight housing 139, which contains an inductor coil assembly 140 and a flow distribution plate 133. The additional inductor 131 may have a first inductor fluid connector 132, a second inductor fluid connector 136, and a flow splitter 134 proving fluidic access to the interior of the liquid-tight housing 139. The flow splitter 134 is an optional component and may not be present if the additional inductor 131 is not used. When the additional inductor 131 is present, the flow splitter 134 provides for parallel (e.g., inverse) flow of the plate-cooling liquid 179 through both inductors. The flow-splitting aspects may be extended to more than two inductor assemblies and multiple electrical phases between inductors if needed. Liquid-tight housing 139 surrounding the internal components of the inductor 130 may be manufactured from non-conductive materials, such as polymers. In general, the inductor 130 and the additional inductor 131 are positioned further away from the metal components of the DC-DC converter 100, such as enclosure. Liquid-tight housing 139 may include various seals (e.g., O-rings) to ensure the containment of the inductor-cooling liquid 189 within liquid-tight housing 139.

As noted above, inductor 130 and additional inductor 131 can be fluidically coupled to each other using the first fluid connection 181 and second fluid connection 182 (which can be pipes, flexible hoses, and other suitable components). Referring to FIGS. 1D and 3A, the first inductor fluid connector 132 of the inductor 130 may receive the inductor-cooling liquid 189 from an external pump/heat exchanger, e.g., through the first inductor-cooling coupler 111 positioned on the front plate 104. Inductor-cooling liquid 189 is then directed to the flow splitter 134 of the inductor 130, which directs a first portion (e.g., about 50%) of the inductor-cooling liquid 189, received from the first inductor-cooling coupler 111, to the inductor coil assembly 140 of the inductor 130 and also diverts a second portion (e.g., about remaining 50%) of the inductor-cooling liquid 189 to the first fluid connection 181 (coupled to the flow splitter 134). The other end of the first fluid connection 181 is coupled to the additional inductor 131 or, more specifically, to the second inductor fluid connector 136 of the additional inductor 131. In other words, inductor-cooling liquid 189 at a low temperature enters the inductor 130 through the first inductor fluid connector 132, and, thereafter, the second portion of this inductor-cooling liquid 189 (also at the low temperature) also enters the additional inductor 131 through the second inductor fluid connector 136.

Each inductor 130 and additional inductor 131 comprises an inductor coil assembly 140 with coil fluid pathways 146 extending through the inductor coil assembly 140. Various features of coil fluid pathway 146 are described below with reference to FIGS. 3H-3M. Once the first portion of the inductor-cooling liquid 189 enters the inductor coil assembly 140 of the inductor 130 (from the flow splitter 134), this portion of the inductor-cooling liquid 189 passes through the coil fluid pathways 146 (and potentially receives some heat from the inductor coil assembly 140 thereby cooling the metal sheet 142 of this coil assembly) and then exists the inductor coil assembly 140 through the second inductor fluid connector 136, which is connected to the second fluid connection 182. The second fluid connection 182 is connected to the additional inductor 131 or, more specifically, to flow the splitter 134 of the additional inductor 131, e.g., as schematically shown in FIG. 1D.

As noted above, the second portion of inductor-cooling liquid 189 enters the additional inductor 131 or, more specifically, the inductor coil assembly 140 of the additional inductor 131 through the second inductor fluid connector 136 of the additional inductor 131. The second portion of inductor-cooling liquid 189 then passes through the coil fluid pathways 146 (and potentially receives heat from the inductor coil assembly 140 of the additional inductor 131) and then exists the inductor coil assembly 140 into the flow splitter 134 of the additional inductor 131. At this point, the second portion of the inductor-cooling liquid 189 is combined with the first portion of inductor-cooling liquid 189 (received from the second fluid connection 182 through the flow splitter 134 of the additional inductor 131) within the flow splitter 134 of the additional inductor 131 and is then collectively directed to the first inductor fluid connector 132 of the additional inductor 131. In some examples, the first inductor fluid connector 132 of the additional inductor 131 is coupled to the second inductor-cooling coupler 112 positioned on the front plate 104, which can then direct the combined inductor-cooling liquid 189 back to the external heat pump/heat exchanger. However, other fluid management examples are also within the scope.

Figure 3E:
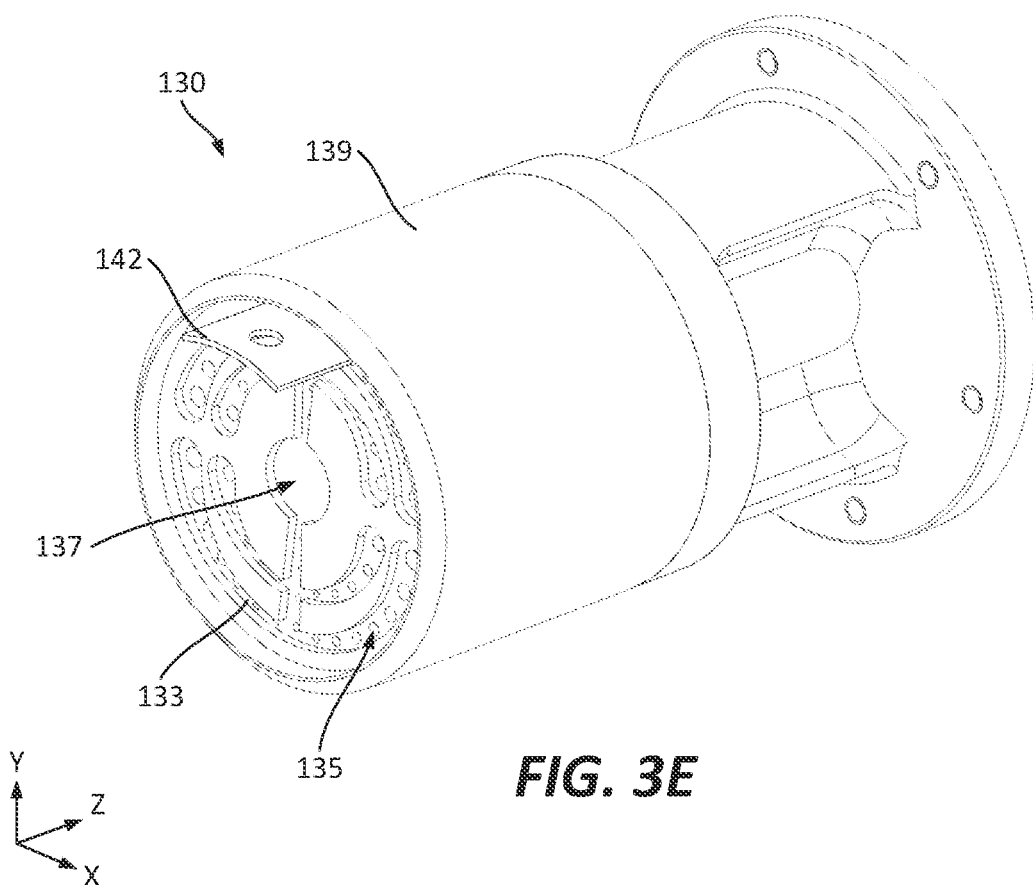
FIGS. 3E and 3F are two schematic views of the inductor coil assembly with one cover removed to illustrate various features of the flow distribution plate, in accordance with some examples.
Figure 3F:
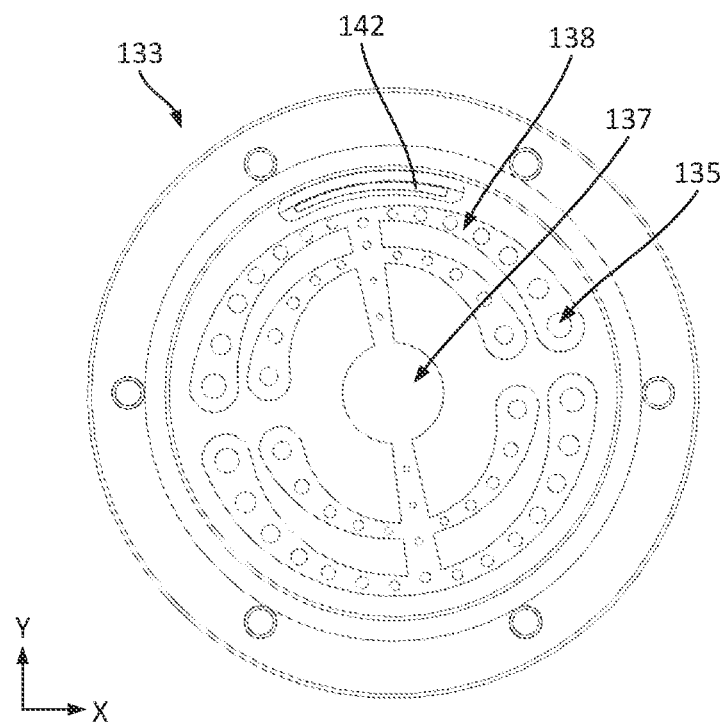

Referring to FIGS. 3E-3F, in some examples, the inductor 130 comprises a flow distribution plate 133, which is placed on the flow path of plate-cooling liquid 179, e.g., when the plate-cooling liquid 179 enters the cavity of the liquid-tight housing 139 that contains the inductor coil assembly 140 and/or when the plate-cooling liquid 179 leaves this cavity. Specifically, a flow distribution plate 133 can be positioned along the flow path and between the inductor coil assembly 140 and a combination of the flow splitter 134 and the first inductor fluid connector 132. In some examples, another flow distribution plate 133 can be positioned along the flow path and between the inductor coil assembly 140 and a combination of the second inductor fluid connector 136.

Referring to FIGS. 3E-3F, in some examples, the flow distribution plate 133 comprises a set of distribution openings 135, protruding through the flow distribution plate 133 and allowing the plate-cooling liquid 179 to pass through the flow distribution plate 133. The flow distribution plate 133 may also comprise a center protrusion 137, which can face either the first inductor fluid connector 132 or the second inductor fluid connector 136 and be fluidically coupled to one of these connectors. The set of distribution openings 135 is fluidically coupled to the center protrusion 137 by a set of distribution channels 138. The center protrusion 137 and the set of distribution channels 138 do not protrude through the flow distribution plate 133. For example, the plate-cooling liquid 179 may enter the center protrusion 137 and be directed by the set of distribution channels 138 to the set of distribution openings 135, which allow the plate-cooling liquid 179 to pass through the flow distribution plate 133 and, e.g., reach the inductor coil assembly 140 positioned on the other side of the flow distribution plate 133.

Referring to FIGS. 3E-3F, in some examples, different distribution openings 135 have different sizes of openings. Specifically, as the flow distance from the center protrusion 137 increases, the size of the distribution openings 135 also increases, e.g., to accommodate for the pressure drops within the set of distribution channels 138 due to the flow restrictions and losses of the plate-cooling liquid 179 (as the plate-cooling liquid 179 passes through the distribution openings 135 positioned along the path). In some examples, a ratio of the size of the distribution opening 135 most remote from the center protrusion 137 to the size of the distribution opening 135 closest to the center protrusion 137 is at least 2, at least 4, or even at least 6. Referring to FIGS. 3E-3F, in some examples, the width of the distribution channels 138 as these channels extend further away from the center protrusion 137. In some examples, the width of the distribution channel 138 is proportional to the size of the distribution opening 135 at that location in the channel.

Figure 3G:
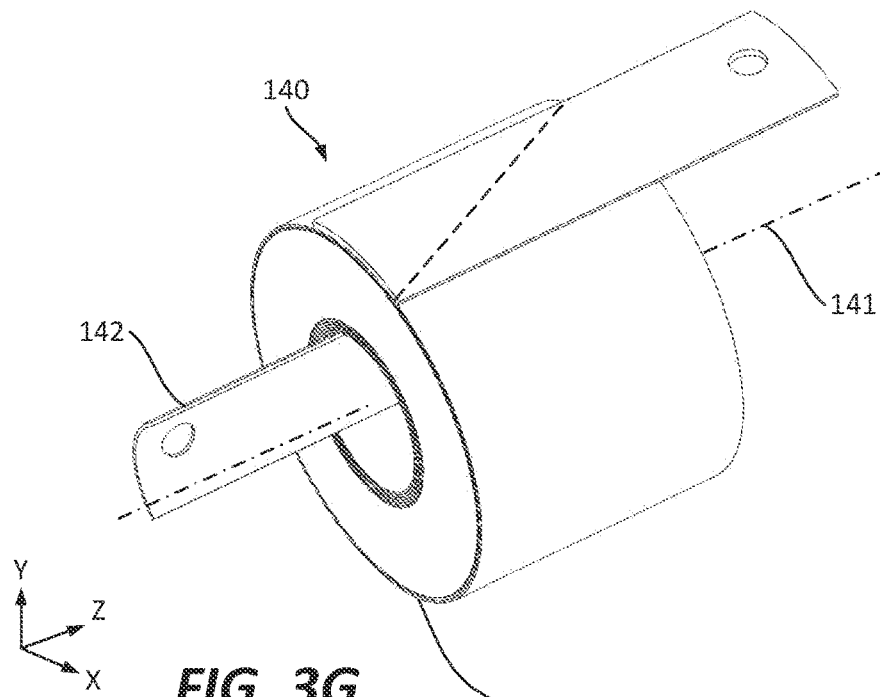
FIG. 3G is a schematic perspective view of the inductor coil assembly removed from the enclosure, in accordance with some examples.
Figure 3H:
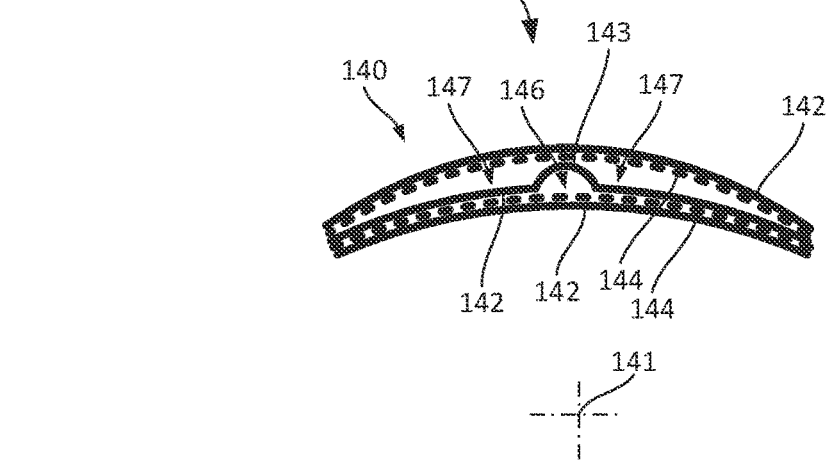
FIG. 3H is a schematic cross-sectional view of a portion of the inductor coil assembly, illustrating a groove forming a coil fluid pathway between metal and insulator sheets, in accordance with some examples.

Referring to FIGS. 3G and 3H, in some examples, inductor coil assembly 140 comprises metal sheet 142 and insulator sheet 144 stacked and wound into a coil, forming inductor coil assembly 140. The inductor coil assembly 140 is defined by coil axis 141, e.g., as shown in FIG. 3G, around which the coil is formed. This type of inductor coil assembly 140 may be referred to as a "foil wound inductor" or simply a "foil inductor".

In some examples, metal sheet 142 is formed from copper, however, other metals or metal alloys may be utilized. The thickness of metal sheet 142 may be selected to minimize AC-winding losses or total DC and AC winding losses. Furthermore, the thickness of metal sheet 142 may be selected to maintain the electrical current density, e.g., less than 10 A/mm$^2$, less than 5 A/mm$^2$, or less than 3 A/mm$^2$.

Referring to FIG. 3G, in some examples, a portion of the metal sheet 142 can be folded as tabs for making electrical and mechanical connections to inductor coil assembly 140. Alternatively, pre-formed tabs may be welded directly to metal sheet 142.

In some examples, insulator sheet 144 may consist of polyethylene (PE), polytetrafluoroethylene (PTFE), or similar materials. The thickness of insulator sheet 144 needs to be sufficient to prevent the electrical breakdown between adjacent layers/turns of metal sheet 142. In some examples, the insulator sheet 144 is adhered to one side of the metal sheet 142, which helps with handling the inductor coil assembly 140.

Figure 3I:
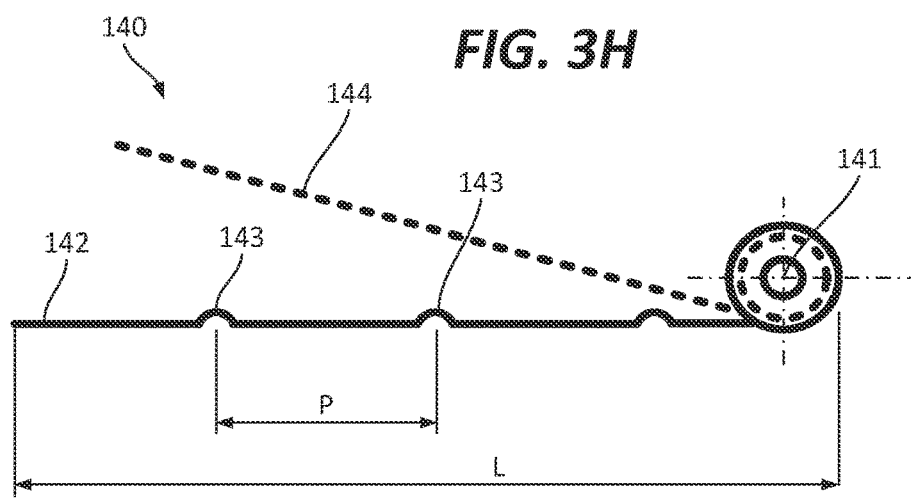
FIG. 3I is a schematic cross-sectional side view of the inductor coil assembly while the metal and insulator sheets are being wound, in accordance with some examples.

FIG. 3H shows a portion of inductor coil assembly 140 illustrating one example of metal sheet 142 comprising grooves 143. These grooves 143 extend parallel to the coil axis 141 forming cooling fluid pathways 146 through inductor coil assembly 140. These coil fluid pathways 146 allow the inductor-cooling liquid 189 to flow through the inductor coil assembly 140 while directly contacting with metal sheet 142 thereby providing the immersion cooling to the metal sheet 142 (or, more generally, to the inductor coil assembly 140). Specifically, groves 143 may run the full length of the metal sheet 142, e.g., as shown in FIG. 3I illustrating a partially unwound inductor coil assembly 140. In some examples, the grooves 143 are positioned at a set distance/pitch (P) from each other. However, once the metal sheet 142 is wound into the inductor coil assembly 140, the position of the grooves 143, e.g., relative to the coil axis 141, will be determined based on the axial and radial positions. For example, the groves 143 in metal sheet 142 may not align radially as the inductor coil assembly 140 is wound. Since the radial position of metal sheet 142 increases in the inductor coil assembly 140 as the inductor coil assembly 140 is wound (away from the coil axis 141), this change in the radial position creates a semi-randomized distribution of cooling pathways 146 throughout the inductor coil assembly 140. Grooves 143 can have various shapes, e.g., semi-circular (shown in FIG. 3G), or any partial polygon shape that provides sufficient cooling fluid pathways and structural support within the wound structure.

FIG. 3I shows metal sheet 142 being wound into the inductor coil together with insulator sheet 144. In some examples, the total length of the metal sheet 142 is 3-20 meters or, more specifically, 5-10 meters. This length determines the power rating capabilities of inductor 130. In the same or other examples, the grove spacing is between 30-70 millimeters or, more specifically, 40-60 millimeters. The grove spacing, which can be also referred to as pitch (P), can be determined based on the size of each groove 143, the number of grooves 143, and the total cross-sectional area of the coil fluid pathways 146 (used as fluid passages).

In some examples, corrugated metal sheet 142 can be used such that the grove spacing is zero. More specifically, grooves 143 may alternate and protrude in two opposite directions from the plane of the metal sheet 142. Such groves may be smaller than the grooves separated by a non-zero pitch and allow a larger contact area of the metal sheet 142 and the inductor-cooling liquid 189. However, such zero-pitch groves 143 may cause significant flow restriction.

Figure 3J:
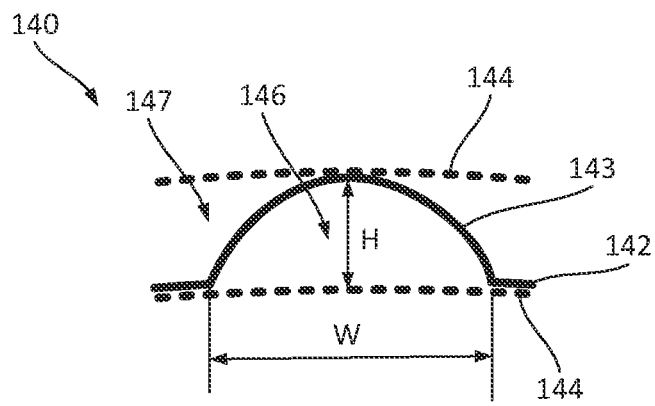
FIGS. 3J, 3K, and 3L are schematic cross-sectional views of different examples of a groove formed by the metal and insulator sheets, in accordance with some examples.

Referring to FIG. 3J, in some examples, grooves 143 can also be defined by the groove height (H), which, in some examples, is 0.2-0.8 millimeters, more specifically, 0.3-0.5 millimeters. For purposes of this disclosure, the groove height (H) is defined as the maximum out-plane deviation when the metal sheet 142 is unwound as in FIG. 3I. Furthermore, grooves 143 can also be defined by the groove width (W), which, in some examples, is 0.3-1 millimeters, more specifically, 0.4-0.7 millimeters. For purposes of this disclosure, the groove height (W) is defined as the distance between a pair of adjacent in-plane portions of metal sheet 142 when metal sheet 142 is unwound as in FIG. 3I.

Referring to FIG. 3H, in some examples, grooves 143 further form additional coil fluid pathways 147 such that each adjacent pair of the additional coil fluid pathways 147 is separated by the metal sheet 142, formed into the groove 143. The additional coil fluid pathways 147 have an elongated shape tapering away from the corresponding grooves 143. It should be noted that inductor-cooling liquid 189 can flow through both the coil fluid pathways 146 and the additional coil fluid pathways 147.

In alternate examples, the function of grooves 143 may be accomplished by inserting various spacers (e.g., tubes) into the inductor coil assembly 140 while the inductor coil assembly 140 is being wound. These inserts can form coil fluid pathways 146 and/or additional coil fluid pathways 147 as described above.

Referring to FIG. 3J, in some examples, insulator sheet 144 does not conform to metal sheet 142 at the location of grooves 143. As such, each coil fluid pathway 146 is formed between the groove 143 (formed from the metal sheet 142) and one insulator sheet 144. Likewise, each additional coil fluid pathway 147 is formed around and between the groove 143 (formed from the metal sheet 142) and another insulator sheet 144.

Figure 3K:
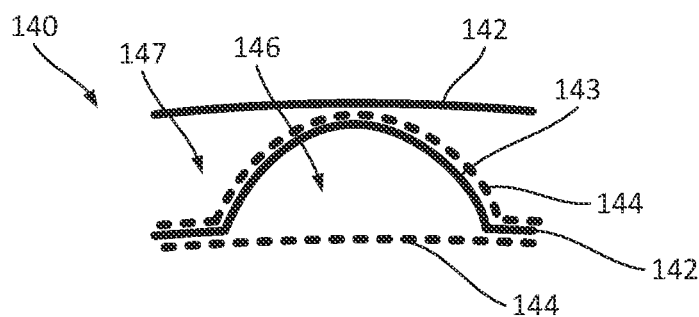
Figure 3L:
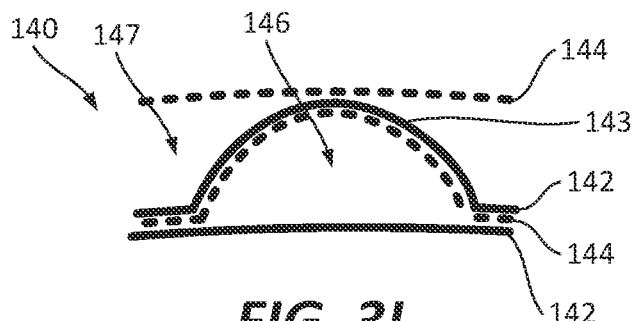
Figure 3M:
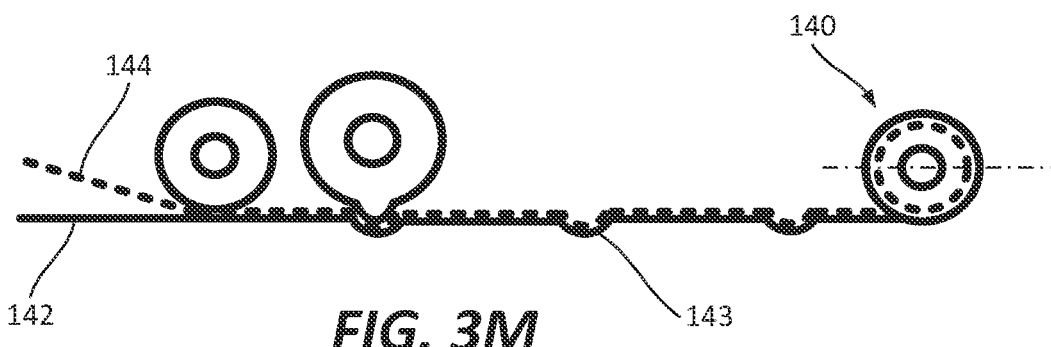
FIG. 3M is a schematic cross-sectional side view of the inductor coil assembly while the metal and insulator sheets are laminated, shaped, and wound, in accordance with some examples.

Referring to FIGS. 3K and 3L, in some examples, insulator sheet 144 conforms to metal sheet 142 at the location of grooves 143. Specifically, in FIG. 3K example, the concave surface of groove 143 is formed by the metal sheet 142 while the convex surface of groove 143 is formed by the insulator sheet 144. In FIG. 3L example, the convex surface of groove 143 is formed by the metal sheet 142 while the concave surface of groove 143 is formed by the insulator sheet 144. Such examples can be made by laminating metal sheet 142 and insulator sheet 144 before forming grooves 143. For example, FIG. 3M illustrates a process of forming the example of inductor coil assembly 140 in FIG. 3L.

Various examples of inductor-cooling liquid 189 are within the scope, e.g., automotive transmission fluid (ATF), transformer oil (e.g., mineral oils), and the like. The inductor-cooling liquid 189 is electrically insulating with a dielectric breakdown voltage of at least 1 kV or even at least 2 kV. Once the inductor-cooling liquid 189 is passed through the inductors, the heated liquid can be pumped through an external heat exchanger where the liquid is cooled. One or more temperature sensors may be embedded along the flow path of the inductor-cooling liquid 189 (e.g., within the inductor coil assembly 140) to provide closed-loop control within the inductor cooling system 180, e.g., to control the volumetric flow rate of the external pump (to keep the temperature of the inductor coil assembly 140 below the maximum temperature threshold). Specifically, the volumetric flow rate of the inductor-cooling liquid 189 through the inductor coil assembly 140 can be adjusted based on the temperature of the inductor-cooling liquid 189, e.g., upon exiting the inductor coil assembly 140. In the same or other examples, the duty cycle/power output of the DC-DC converter 100 is adjusted based on the temperature of the inductor-cooling liquid 189.

Vehicle Charging Systems and Other Applications of DC-DC Converters

DC-DC converters 100 described above can be used for various applications, such as electric vehicle charging or, more specifically, for charging one vehicle using a power source (e.g., a battery) of another vehicle. For example, some types of electric vehicles (e.g., tractors) require extensive or even continuous operations and cannot be stopped for charging using stationary chargers. Furthermore, stationary chargers or, more specifically, stationary fast chargers (e.g., charging at 150 kW or more) may not be available close to the operating locations of such electric vehicles (e.g., in farming communities). At the same time, specially-designed recharge vehicles may be used to charge remotely and then drive to the operating locations of the work vehicles to charge these work vehicles as will now be described with reference to reference to FIGS. 4A and 4B.

Figure 4A:
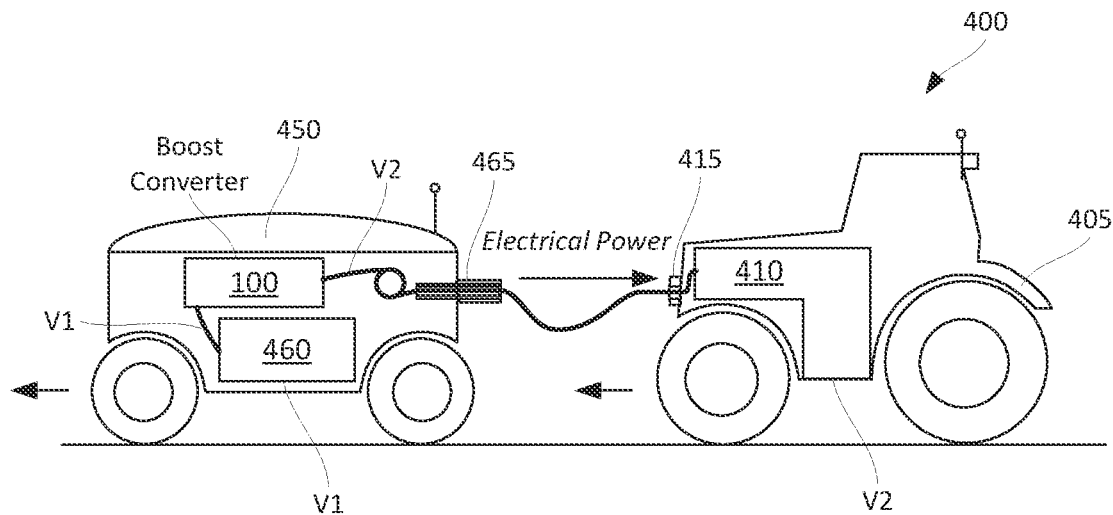
FIG. 4A is a schematic side view of a vehicle charging system comprising a recharge vehicle and a work vehicle being electrically connected for charging, in accordance with some examples.

FIG. 4A is a schematic illustration of a vehicle charging system 400 comprising a recharge vehicle 450 and a work vehicle 405, in accordance with some examples. Both the recharge vehicle 450 and the work vehicle 405 are electric vehicles, e.g., use electric power to propel these vehicles and perform various operations, and may be referred to as an electric recharge vehicle and an electric work vehicle. In some examples, the work vehicle 405 is a tractor, farming vehicle, or other like vehicle. The recharge vehicle 450 can be a special-purpose vehicle, designed to charge the work vehicle 405.

Referring to FIG. 4A, in some examples, the recharge vehicle 450 comprises a recharge-vehicle battery 460 operating at a first voltage (V1). It should be noted that the first voltage (V1) can vary depending on the state of charge (SOC) of the recharge-vehicle battery 460, e.g., up 15-20% above and below the nominal voltage (based 3.0-4.2V range for lithium-ion cells). For example, the nominal voltage of the recharge-vehicle battery 460 can be between 300-500 Volts. The recharge vehicle 450 also comprises a recharge-vehicle charging port 465 and a DC-DC converter 100 electrically interconnecting recharge-vehicle battery 460 and recharge-vehicle charging port 465. The DC-DC converter 100 is designed to bring the voltage provided to the recharge-vehicle charging port 465 to a second voltage (V2), which is higher than the first voltage (V1) of the recharge-vehicle battery 460.

The work vehicle 405 comprises a work-vehicle battery 410 operating at a second voltage (V2) and a work-vehicle charging port 415 electrically coupled to a work-vehicle battery 410. Similar to the first voltage (V1) described above, the second voltage (V1) can range depending on the state of charge (SOC) of the work-vehicle battery 410, e.g., up 15-20% above and below the nominal voltage (based 3.0-4.2V range for lithium-ion cells). However, at any SOC of the recharge-vehicle battery 460 and the work-vehicle battery 410, the first voltage (V1) is less than the second voltage (V1). It should be noted that when the recharge-vehicle battery 460 is used to charge the work-vehicle battery 410, the SOC of the recharge-vehicle battery 460 and the first voltage (V1) decrease, while the SOC of the work-vehicle battery 410 and the second voltage (V2) increase. As such, the ratio of the first voltage (V1) to the second voltage (V2) changes during charging.

A combination of the recharge-vehicle charging port 465 and the work-vehicle charging port 415 is configured to form an electrical connection. For example, at least one (or both) of the work-vehicle charging port 415 and the recharge-vehicle charging port 465 comprise a telescopic extender that can extend between the recharge vehicle 450 and the work vehicle 405 when the vehicles are positioned proximate to each other. This connection between the corresponding charging ports interconnects the DC-DC converter 100 and the work-vehicle battery 410 and allows the transmission of electrical power from the recharge-vehicle battery 460 (through the DC-DC converter 100) to the work-vehicle battery 410. In some examples, the connection between the recharge-vehicle charging port 465 and the work-vehicle charging port 415 can be formed while the recharge vehicle 450 and the work vehicle 405 are moving. In the same or other examples, electrical power is transmitted from the recharge-vehicle battery 460 to the work-vehicle battery 410 while both the recharge vehicle 450 and the work vehicle 405 are moving. For example, the recharge vehicle 450 can move in front of the work vehicle 405 such that the work vehicle 405 can perform various operations behind the work vehicle 405. For example, the work vehicle 405 can be equipped with a power takeoff (PTO) unit on the side opposite the work-vehicle charging port 415. The PTO unit can be powered from the work-vehicle battery 410.

In some examples, the work vehicle 405 is a human-controlled vehicle, while the recharge vehicle 450 is an autonomous vehicle. In these examples, the recharge-vehicle steering system (of the recharge vehicle 450) may be controlled based on the driver's input to the work-vehicle steering system (of the work vehicle 405), e.g., while the recharge vehicle 450 moves in front of the work vehicle 405. In other words, the driver's steering input can steer both the recharge vehicle 450 (which is the leading vehicle) and the work vehicle 405 (which is the following vehicle). In other examples, each of work vehicle 405 and recharge vehicle 450 is an autonomous vehicle. The movement of work vehicle 405 is based on the movement of recharge vehicle 450 while recharge vehicle 450 moves in front of work vehicle 405.

As noted above, the DC-DC converter 100 is configured to boost the first voltage (V1) to the second voltage (V2), which can change based on the SOC of the corresponding batteries, while transmitting electrical power from recharge-vehicle battery 460 to work-vehicle battery 410. While FIG. 4A illustrates that a DC-DC converter 100 is a part of the recharge vehicle 450 (e.g., to minimize the weight of the work vehicle 405. In some examples, a DC-DC converter 100 can be positioned on the work vehicle 405.

Various examples and features of DC-DC converter 100 are described above. Overall, the vehicle charging system 400 is configured to transmit the electrical power from recharge-vehicle battery 460 to work-vehicle battery 410 at a level of at least 100 kW, at least 200 kW, at least 500 kW, or even at least 1,000 kW. For example, multiple DC-DC converters 100 can be connected in parallel to ensure higher power transmission capabilities. As noted above, in some examples, vehicle charging system 400 is configured to transmit electrical power from recharge-vehicle battery 460 to work-vehicle battery 410 while both recharge-vehicle battery 460 and work-vehicle battery 410 are moving.

Figure 4B:
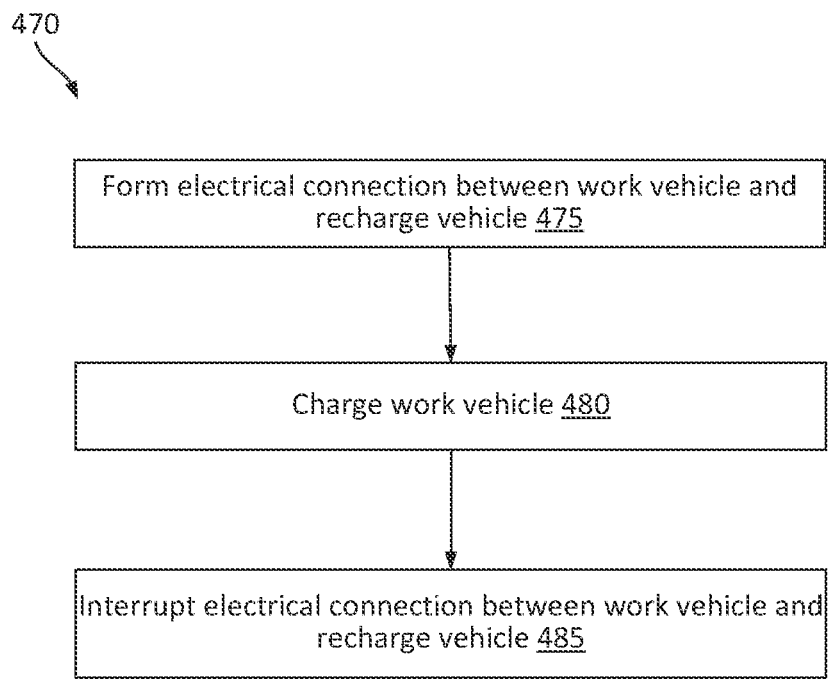
FIG. 4B is a process flowchart of a method for charging a work vehicle using a recharge vehicle, in accordance with some examples.

FIG. 4B illustrates a process flowchart corresponding to method 470 of remote charging of a work vehicle 405 using a recharge vehicle 450, in accordance with some examples. As described above, a combination of the work vehicle 405 and recharge vehicle 450 for a vehicle charging system 400. Various examples of work vehicles 405 and recharge vehicles 450 as well as their components (e.g., a DC-DC converter 100) are described above.

Method 470 comprises (block 475) forming an electrical connection between the work vehicle 405 and recharge vehicle 450. As noted above, the recharge vehicle 450 may be equipped with a recharge-vehicle charging port 465, while the work vehicle 405 may be equipped with a work-vehicle charging port 415. The recharge-vehicle charging port 465 and work-vehicle charging port 415 can form this electrical connection. The electrical connection can remain while the work vehicle 405 and recharge vehicle 450 are moving. In some examples, the electrical connection is formed while the work vehicle 405 and recharge vehicle 450 are moving.

Method 470 proceeds with (block 480) charging the work-vehicle battery 410 by transmitting electric power from the recharge-vehicle battery 460 to the work-vehicle battery 410 through the electrical connection while the DC-DC converter 100 boosts the first voltage (V1) of the recharge-vehicle battery 460 to the second voltage (V2) of the work-vehicle battery 410. This voltage boosting aspect allows overcoming the voltage variations caused by the SOC changes of both batteries while the electric power is transferred.

In some examples, the inductor 130 of the DC-DC converter 100 is immersion-liquid cooled using an inductor-cooling liquid 189. In these examples, while the DC-DC converter 100 boosts the first voltage (V1) to the second voltage (V2), the inductor-cooling liquid 189 is pumped through the inductor 130 or, more specifically, through the coil fluid pathways 146 in the inductor coil assembly 140 of the inductor 130 as described above.

In some examples, while the electric power is transmitted from the recharge-vehicle battery 460 to the work-vehicle battery 410, the inductor-cooling liquid 189 is further pumped through the recharge-vehicle battery 460. In more specific examples, the inductor-cooling liquid 189 (and some components used for cooling and pumping the inductor-cooling liquid 189) can be shared by the recharge-vehicle battery 460 and the DC-DC converter 100. For example, a vehicle controller may control the flow rates of the inductor-cooling liquid 189 through the recharge-vehicle battery 460 and the DC-DC converter 100.

In some examples, work vehicle 405 and recharge vehicle 450 synchronously move while electric power is transmitted from recharge-vehicle battery 460 to work-vehicle battery 410 such that the electrical connection between work vehicle 405 and recharge vehicle 450 remains intact.

Method 470 proceeds with (block 485) interrupting the electrical connection between the work vehicle 405 and recharge vehicle 450. For example, the recharge-vehicle charging port 465 may be decoupled from the work-vehicle charging port 415. This disconnection operation may be performed while work vehicle 405 and recharge vehicle 450 are moving.

Methods of Operating DC-DC Converters

Figure 5:
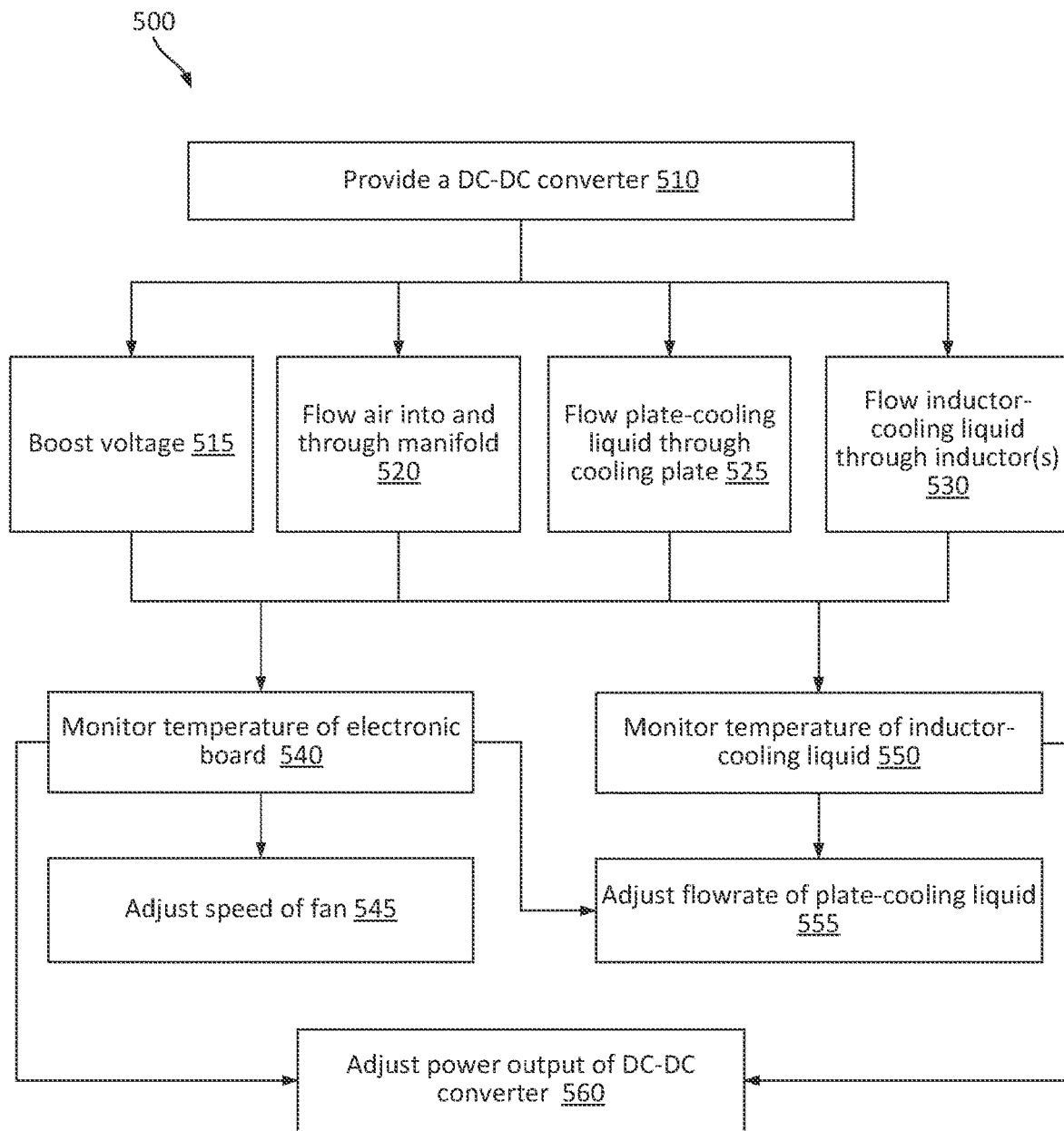
FIG. 5 is a process flowchart of a method of operating a DC-DC converter, in accordance with some examples.

FIG. 5 is a process flowchart corresponding to method 500 of operating a DC-DC converter 100, in accordance with some examples. Different examples of the DC-DC converter 100 as well as different applications of the DC-DC converter 100 are described above. In some examples, method 500 commences with (block 510) providing a DC-DC converter 100. At this stage, the DC-DC converter 100 can be electrically coupled (e.g., to a recharge-vehicle battery 460 and/or to the work-vehicle battery 410). The DC-DC converter 100 can also be fluidically coupled to external liquid cooling and pumping systems, e.g., one system for plate-cooling liquid 179 and a separate system for inductor-cooling liquid 189.

Method 500 may comprise (block 515) boosting voltage using the DC-DC converter 100, e.g., to boost the output voltage (V out) relative to the input voltage (V in). The input voltage (V in) may correspond to the first voltage (V1) of the recharge-vehicle battery 460, while the output voltage (V out) may correspond to the second voltage (V2) of the work-vehicle battery 410. In some examples, the first voltage and second voltage may change during the operation of the DC-DC converter 100. Specific voltage-boosting aspects of the DC-DC converter 100 are described above. For example, the pulse-width modulation (PWM) signal may be controlled to change the boosting capabilities of the DC-DC converter 100.

Method 500 may proceed with (block 520) flowing air into and through a manifold 160 using a fan 154. As noted above, the DC-DC converter 100 comprises an electronic module cooling unit 150, which in turn comprises a manifold 160, a fan 154, and a heat exchanger 152. The air releases heat to the heat exchanger 152 while passing through the heat exchanger 152. Thereafter, the cooled air is uniformly released to the power electronic module 120.

Method 500 may further comprise (block 525) flowing plate-cooling liquid 179 through a cooling plate 170. Specifically, the cooling plate 170 may be thermally coupled to the heat exchanger 152 and, in some examples, thermally coupled directly to parts of the power electronic module 120, e.g., to the switches. As such, the plate-cooling liquid 179 is heated while passing through the cooling plate 170 and removes the heat from the power electronic module 120 or, more generally, from the DC-DC converter 100. Additional cooling of the inductor 130 is provided by inductor-cooling liquid 189.

Specifically, method 500 may further comprise (block 530) flowing the inductor-cooling liquid 189 through an inductor 130 and, in some examples, through an additional inductor 131 of DC-DC converter 100. More specifically, the inductor-cooling liquid 189 flows through the coil fluid pathways 146 in the inductor coil assembly 140 of the inductor 130 (and the same coil fluid pathways of the additional inductor 131 if one is present).

It should be noted that the inductor-cooling liquid 189 is different from the plate-cooling liquid 179. This inductor-cooling liquid pumping/flowing operation may be performed while the DC-DC converter 100 is operational (e.g., boosting the output voltage).

Method 500 may further comprise (block 540) monitoring the temperature of the power electronic module 120 and (block 545) adjusting the speed of fan 154, e.g., based on the temperature of the power electronic module 120. In the same or other examples, method 500 may further comprise (block 540) flowing an inductor-cooling liquid 189 through the coil fluid pathways 146 while operating DC-DC converter 100. Method 500 may further comprise (block 550) monitoring the temperature of inductor-cooling liquid 189 upon exiting inductor coil assembly 140.

In some examples, method 500 further comprises (block 555) adjusting the volumetric flow rate of inductor-cooling liquid 189 through inductor coil assembly 140 based on the temperature of inductor-cooling liquid 189 upon exiting inductor coil assembly 140. In some examples, method 500 further comprises (block 560) adjusting the power output of DC-DC converter 100, e.g., based on the temperature of inductor-cooling liquid 189 upon exiting inductor coil assembly 140.

CONCLUSION

Although the foregoing concepts have been described in some detail for purposes of clarity of understanding, it will be apparent that certain changes and modifications may be practiced within the scope of the appended claims. It should be noted that there are many alternative ways of implementing processes, systems, and apparatuses. Accordingly, the present examples are to be considered illustrative and not restrictive.

The invention claimed is:

1. A DC-DC converter comprising:
   an enclosure;
   a front plate sealed against the enclosure using a set of fasteners and collectively with the enclosure defining a converter volume (V);
   a converter unit comprising a switching sub-module, a diode sub-module, and an inductor, wherein the switching sub-module and the diode sub-module are arranged into a power electronic module;

an additional converter unit comprising an additional switching sub-module, an additional diode sub-module, and an additional inductor, wherein:
the additional switching sub-module and the additional diode sub-module are arranged into an additional power electronic module,
the switching sub-module and the additional switching sub-module are configured to operate out of phase, and
a ratio of power output (P) of the DC-DC converter to the converter volume (V) is at least 2 kW per liter;
a first inductor-cooling coupler; and
a second inductor-cooling coupler, wherein:
each of the first inductor-cooling coupler and the second inductor-cooling coupler protrudes through and is supported by the front plate, and
each of the first inductor-cooling coupler and the second inductor-cooling coupler is fluidically coupled to the inductor and the additional inductor.

2. The DC-DC converter of claim 1, wherein the ratio of the power output (P) of the DC-DC converter to the converter volume (V) is at least 4 kW per liter.

3. The DC-DC converter of claim 1, wherein:
the power output (P) of the DC-DC converter is at least 150 kW, and
the converter volume (V) is less than 50 liters.

4. The DC-DC converter of claim 1, wherein:
the power output (P) of the DC-DC converter is at least 200 kW, and
the converter volume (V) is less than 40 liters.

5. The DC-DC converter of claim 1, wherein each of the inductor and the additional inductor is immersion-liquid cooled.

6. The DC-DC converter of claim 1, further comprising low-voltage connectors, high-voltage connectors, a set of low-voltage capacitors, and a set of high-voltage capacitors, wherein:
each of the low-voltage connectors and the high-voltage connectors protrudes through and is supported by the front plate,
the set of low-voltage capacitors is connected across the low-voltage connectors, and
the set of high-voltage capacitors is connected across the high-voltage connectors.

7. The DC-DC converter of claim 6, wherein the set of high-voltage capacitors comprises three capacitors connected in parallel.

8. The DC-DC converter of claim 1, further comprising a cooling plate, a first plate-cooling coupler, and a second plate-cooling coupler, wherein:
each of the first plate-cooling coupler and the second plate-cooling coupler protrudes through and is supported by the front plate,
each of the first plate-cooling coupler and the second plate-cooling coupler is fluidically coupled to the cooling plate, and
the cooling plate is fluidically isolated from the inductor and the additional inductor.

9. The DC-DC converter of claim 8, wherein the cooling plate is positioned between and thermally coupled to each of (1) a first set of the switching sub-module and the diode sub-module and (2) a second set of the additional switching sub-module and the additional diode sub-module.

10. The DC-DC converter of claim 8, wherein the cooling plate comprises an interior cavity, extending between a cavity inlet and a cavity outlet and configured to flow a plate-cooling liquid through the cooling plate between the cavity inlet and the cavity outlet.

11. The DC-DC converter of claim 8, further comprising a heat exchanger and an additional heat exchanger, wherein the cooling plate is positioned between and thermally coupled to each of the heat exchanger and the additional heat exchanger.

12. The DC-DC converter of claim 8, wherein the converter unit and the additional converter unit are configured to operate out of phase.

13. The DC-DC converter of claim 8, wherein:
the power electronic module is electrically connected to the inductor,
the additional power electronic module is electrically connected to the additional inductor, and
the cooling plate extends between the inductor and the additional inductor.

14. The DC-DC converter of claim 1, wherein:
the inductor comprises a metal sheet and an insulator sheet stacked and wound together into an inductor coil assembly, comprising a coil axis, and
the metal sheet comprises grooves, extending parallel to the coil axis and forming coil fluid pathways together with the insulator sheet and remaining portions of the metal sheet.

15. A method of operating a DC-DC converter, the method comprising:
providing the DC-DC converter comprising an enclosure, a front plate, a converter unit, and an additional converter unit, wherein:
a front plate is sealed against the enclosure using a set of fasteners and collectively with the enclosure defines a converter volume (V);
the converter unit comprising a switching sub-module, a diode sub-module, and an inductor; and
the additional converter unit comprises an additional switching sub-module, an additional diode sub-module, and an additional inductor, and
a ratio of power output (P) of the DC-DC converter to the converter volume (V) is at least 2 kW per liter; and
operating the DC-DC converter to boost an output voltage relative to an input voltage at a power of at least 200 kW, wherein:
the DC-DC converter further comprises a cooling plate fluidically isolated from the inductor and the additional inductor and thermally coupled to the switching sub-module and the additional switching sub-module, and
operating the DC-DC converter comprises flowing a plate-cooling liquid through the cooling plate.

16. The method of claim 15, wherein operating the DC-DC converter comprises flowing an inductor-cooling liquid through the inductor and the additional inductor such that the inductor and the additional inductor are immersion-liquid cooled.

17. The method of claim 16, wherein the converter unit and the additional converter unit are configured to operate out of phase.

18. The method of claim 16, wherein the converter volume (V) is less than 50 liters.

19. The method of claim 16, wherein:
the inductor comprises a metal sheet and an insulator sheet stacked and wound together into an inductor coil assembly, comprising a coil axis, the metal sheet comprises grooves, extending parallel to the coil axis and forming coil fluid pathways together with the insulator sheet and remaining portions of the metal sheet, and operating the DC-DC converter further comprises flowing an inductor-cooling liquid through the coil fluid pathways formed by the grooves.

* * * * *